(12) United States Patent
Feng

(10) Patent No.: US 11,088,648 B2
(45) Date of Patent: Aug. 10, 2021

(54) INTELLIGENT POWER MODULE AND CONTROLLER FOR AIR CONDITIONER

(71) Applicant: GD MIDEA AIR-CONDITIONING EQUIPMENT CO., LTD., Guangdong (CN)

(72) Inventor: Yuxiang Feng, Guangdong (CN)

(73) Assignee: GD MIDEA AIR-CONDITIONING EQUIPMENT CO., LTD., Foshan (CN)

(*) Notice: Subject to any disclaimer, the term of this patent is extended or adjusted under 35 U.S.C. 154(b) by 16 days.

(21) Appl. No.: 16/813,945

(22) Filed: Mar. 10, 2020

(65) Prior Publication Data

US 2020/0212836 A1   Jul. 2, 2020

Related U.S. Application Data

(63) Continuation of application No. PCT/CN2018/076068, filed on Feb. 9, 2018.

(30) Foreign Application Priority Data

Sep. 11, 2017  (CN) .......................... 201710815563.X
Sep. 11, 2017  (CN) .......................... 201710815564.4
(Continued)

(51) Int. Cl.
*H02P 29/024* (2016.01)
*F24F 11/46* (2018.01)
(Continued)

(52) U.S. Cl.
CPC ............ *H02P 29/026* (2013.01); *F24F 11/46* (2018.01); *H02P 27/06* (2013.01); *H03K 17/08116* (2013.01)

(58) Field of Classification Search
CPC ......... H02P 29/026; H02P 27/06; F24F 11/46; H03K 17/08116
See application file for complete search history.

(56) References Cited

U.S. PATENT DOCUMENTS

| 2013/0082762 | A1  | 4/2013 | Gan et al. |
| 2017/0110999 | A1* | 4/2017 | Shimada ................. H02P 23/03 |
| 2019/0135119 | A1* | 5/2019 | Nozawa ................. B60L 53/24 |

FOREIGN PATENT DOCUMENTS

| CN | 101882795 A | 11/2010 |
| CN | 202978255 U | 6/2013 |

(Continued)

OTHER PUBLICATIONS

Notification of First Review Opinion dated Aug. 28, 2018 received in Chinese Patent Application No. CN 201710816079.9 together with an English language translation.
(Continued)

*Primary Examiner* — Zoheb S Imtiaz
(74) *Attorney, Agent, or Firm* — Scully Scott Murphy & Presser

(57) ABSTRACT

An intelligent power module and a controller for an air conditioner are provided. For the intelligent power module, an adjust circuit is additionally provided between a respective drive circuit and a respective IGBT transistor. The adjust circuit detects a change in the voltage of a low voltage power supply of the intelligent power module in real time, and disables the output of the module when the voltage is detected to be too low due to fluctuation of the low voltage power supply. This operation releases the charge accumulated in the IGBT transistor, when energy storage of a drive motor causes charge accumulation of the IGBT transistor. The adjust circuit can continue releasing the charge when the low voltage power supply is restored to normal, to prevent (Continued)

the operating reliability of the module from being affected by the impact of the charge on internal circuits of the module.

26 Claims, 5 Drawing Sheets

(30) Foreign Application Priority Data

| | | |
|---|---|---|
| Sep. 11, 2017 | (CN) | 201710816079.9 |
| Sep. 11, 2017 | (CN) | 201710816080.1 |
| Sep. 11, 2017 | (CN) | 201710816171.5 |
| Sep. 11, 2017 | (CN) | 201710816172.X |

(51) Int. Cl.
*H02P 27/06* (2006.01)
*H03K 17/081* (2006.01)

(56) References Cited

FOREIGN PATENT DOCUMENTS

| | | |
|---|---|---|
| CN | 103368370 A | 10/2013 |
| CN | 103683917 A | 3/2014 |
| CN | 203480359 U | 3/2014 |
| CN | 203482113 U | 3/2014 |
| CN | 203722218 U | 7/2014 |
| CN | 104158428 A | 11/2014 |
| CN | 104620481 A | 5/2015 |
| CN | 104811023 A | 7/2015 |
| CN | 105024531 A | 11/2015 |
| CN | 105915041 A | 8/2016 |
| CN | 206422700 U | 8/2017 |
| CN | 107492874 A | 12/2017 |
| CN | 107492875 A | 12/2017 |
| CN | 107492876 A | 12/2017 |
| CN | 107492877 A | 12/2017 |
| CN | 107492878 A | 12/2017 |
| JP | 3780898 B2 | 5/2006 |
| JP | 2008-042958 A | 2/2008 |
| KR | 10-2010-0023365 A | 3/2010 |
| WO | 2015/074471 A1 | 5/2015 |
| WO | 107492879 A | 12/2017 |

OTHER PUBLICATIONS

Notification of First Review Opinion dated Sep. 5, 2018 received in Chinese Patent Application No. CN 201710816172.X together with an English language translation.
Notification of First Review Opinion dated Sep. 26, 2018 received in Chinese Patent Application No. CN 201710815563.X together with an English language translation.
Written Opinion of the International Searching Authority dated Jun. 7, 2018 received in International Application No. PCT/CN2018/076068.
International Search Report dated Jun. 7, 2018 received in International Application No. PCT/CN2018/076068.

* cited by examiner

INTELLIGENT POWER MODULE AND CONTROLLER FOR AIR CONDITIONER

FIELD

The present disclosure relates to the field of intelligent power modules, and more particularly relates to an intelligent power module, and a controller for an air conditioner.

BACKGROUND

Intelligent Power Module (hereinafter "IPM") is a power-driven product that combines technologies of power electronics and integrated circuits. The intelligent power module integrates a power switching device and a high-voltage drive circuit, and it is also provided with fault detection circuits therein for detecting overvoltage, overcurrent and overheating. The intelligent power module receives a control signal of the MCU for driving subsequent circuits on one hand, and sends a state detection signal of the system back to the MCU on the other hand. The intelligent power module is especially suitable for driving inverters and various inverter power sources of motors, and thus is an ideal power electronic device for frequency speed regulation, metallurgical machinery, electric traction, servo drive, and frequency appliances.

The circuit structure of an existing IPM module 100 is shown in FIG. 1, including a High Voltage Integrated Circuit (hereinafter "HVIC") 110, three-phase upper bridge arm Insulated Gate Bipolar Transistors (hereinafter "IGBTs") 111, 112, and 113, three-phase lower bridge arm IGBTs 114, 115, and 116. The HVIC transistor 111 includes a UH drive circuit 101, a VH drive circuit 102, and a WH driver 103 respectively connected to the three-phase upper bridge arm IGBTs, and a UL drive circuit 104, a VL drive circuit 105, and a WL drive circuit 106 respectively connected to the three-phase lower bridge arm IGBTs. These six drive circuits respectively switch the corresponding six IGBTs on and off under the control of six control signals input from the IPM module 100. A commended circuit structure of the IPM module, when the IPM module is being in normal operation, is shown in FIG. 2. The IPM module 100 is connected to an MCU 200 through the six control signals. The U-phase, V-phase, and W-phase output ends of the IPM module 100 are connected to three-phase windings of the motor 139. Capacitors 135, 166, and 137 are respectively connected to the three-phase output ends and bootstrap capacitors of positive electrodes of the power supplies of the corresponding phases. The six control signals output from the MCU200 control the switching states of the six IGBT transistors of the IPM module 100, so that corresponding three-phase drive signals are output to the motor 139 for driving the motor 139. In application, since the IPM module 100 works in a non-ideal environment, the power supply is unstable, which may cause a fluctuation of the low-voltage power supply of the IPM module 100. In the case where the power supply is off, the output of the IPM module 100 may be suddenly disabled. In addition, because inductive energy storage of the motor 139 will generate induced potential and the induced potential will be transmitted to the IPM module 100, charge can be accumulation in the IGBT transistors. The charge may not be completely released in a short time. In response to the power supply resuming normal operation, the residual charge in the IGBT transistor may discharge on the IPM module 100 during the next normal switching cycle, which may affect effective driving of the motor, and cause unnecessary impact of the charge on internal circuits of the IPM module, thereby adversely impacting the operating reliability thereof, as well as impeding a large-scale application of the intelligent power module in the field of frequency conversion.

SUMMARY

According to exemplary embodiments of the present disclosure, an intelligent power module and a controller for an air conditioner are provided. These devices are capable of solving the problem that during the normal operation of the intelligent power module, the charge accumulated in the IGBT transistor due to the fluctuation of the power supply cannot be released in a short time, which may have adverse impacts on effective driving of the motor and the module, thereby decreasing the operating reliability of the module.

In one aspect, the present disclosure provides an intelligent power module including: three-phase upper bridge arm IGBT transistors, three-phase lower bridge arm IGBT transistors, drive circuits and adjust circuits each corresponding to each of the three-phase upper bridge arm IGBT transistors and the three-phase lower bridge arm IGBT transistors;

an output end of each drive circuit is connected to a signal input end of each corresponding adjust circuit, a signal output end of each adjust circuit is connected to a gate of each corresponding IGBT transistor;

a positive electrode and a negative electrode of a power supply end of the adjust circuit corresponding to each three-phase upper bridge arm IGBT transistor are respectively connected to a positive electrode and a negative electrode of a power supply of a high voltage region of a corresponding phase; a positive electrode and a negative electrode of a power supply end of the adjust circuit corresponding to each three-phase lower bridge arm IGBT transistor are respectively connected to a positive electrode and a negative electrode of a power supply of a low voltage region of the intelligent power module;

the adjust circuit is configured to: detect a voltage of the power supply end of the adjust circuit; in response to the detection that the voltage is less than a predetermined voltage threshold, cut off a drive signal output from the drive circuit to the corresponding IGBT transistor; and in response to the detection that the voltage is greater than or equal to the predetermined voltage threshold, release charge in the corresponding IGBT transistor, and control the drive circuit to output the drive signal to the corresponding IGBT transistor after a predetermined time.

In some embodiments, each adjust circuit includes a voltage detection module, a time delay module, an output module, and a first switch; and, wherein:

an input end of the voltage detection module, a power supply end of the time delay module, and a power supply end of the output module are connected to form the power supply end of the adjust circuit; an output end of the voltage detection module is respectively connected to a control end of the time delay module and a control end of the first switch; an output end of the time delay module is connected to a control end of the output module; an input end of the output module is the signal input end of the adjust circuit; an output end of the output module is connected to an input end of the first switch; and an output end of the first switch is the signal output end of the adjust circuit; and, wherein:

in response to the detection that the voltage of the input end of the voltage detection module is less than the predetermined voltage threshold, the voltage detection module is configured to turn the first switch from an on state to an off state;

in response to the detection that the voltage of the input end of the voltage detection module is greater than or equal to the predetermined voltage threshold, the voltage detection module is configured to control the first switch to turn on and the time delay module to start timing, and the time delay module is configured to control the output module to release the charge in the corresponding IGBT transistor; and in response to a determination that a timing reaches a predetermined time, the time delay module is configured to control the drive circuit to output the drive signal to the corresponding IGBT transistor through the output module.

In some embodiments, the time delay module includes a second switch, a first resistor, and a first capacitor; and, wherein:

a control end of the second switch is the control end of the time delay module; an input end of the second switch is connected to the positive electrode of the power supply end of the adjust circuit; a connection end of an output end of the second switch and an end of the first resistor is the output end of the time delay module; the other end of the first resistor is connected to an end of the first capacitor; and the other end of the first capacitor is connected to the negative electrode of the power supply end of the adjust circuit.

In some embodiments, the time delay module further includes a shaping unit;

an input end of the shaping unit is the connection end of the output end of the second switch and the end of the first resistor; an output end of the shaping unit is the output end of the time delay module; and the shaping unit is configured to shape a control signal output from the time delay module and output the shaped control signal to the control end of the output module.

In some embodiments, the shaping unit includes a first NOT gate and a second NOT gate;

an input end of the first NOT gate is the input end of the shaping unit; an output end of the first NOT gate is connected to an input end of the second NOT gate; and an output end of the second NOT gate is the output end of the shaping unit.

In some embodiments, the voltage detection module includes a comparator and a voltage source;

a non-inverting end of the comparator is connected to the positive electrode of the power supply end of the adjust circuit; a positive output end of the voltage source is connected to an inverting end of the comparator; and a negative output end of the voltage source is connected to the negative electrode of the power supply end of the adjust circuit.

In some embodiments, each adjust circuit further includes a shaping and amplifying module;

an input end of the shaping and amplifying module is the signal input end of the adjust circuit; an output end of the shaping and amplifying module is connected to the input end of the output module; and the shaping and amplifying module is configured to amplify and shape a signal input from the signal input end of the adjust circuit, and output the amplified and shaped signal to the input end of the output module.

In some embodiments, the shaping and amplifying module includes a third NOT gate and a fourth NOT gate;

an input end of the third NOT gate is the input end of the shaping and amplifying module; an output end of the third NOT gate is connected to an input end of the fourth NOT gate; and an output end of the fourth NOT gate is the output end of the shaping and amplifying module.

In some embodiments, a size of a MOS transistor in the third NOT gate is half a size of a MOS transistor in the fourth NOT gate.

In some embodiments, the output module includes a third switch, a first PMOS transistor, and a second NMOS transistor;

a control end of the third switch is the control end of the output module; a first selection end of the third switch is connected to the positive electrode of the power supply end of the adjust circuit; a second selection end of the third switch is connected to a gate of the first PMOS transistor; a fixed end of the third switch is connected to a gate of the second NMOS transistor; a source of the first PMOS transistor is connected to the positive electrode of the power supply end of the adjust circuit; a connection end of a drain of the first PMOS transistor and a drain of the second NMOS transistor is the output end of the output module; and a source of the second NMOS transistor is connected to the negative electrode of the power supply end of the adjust circuit.

In some embodiments, the adjust module is further configured to:

detect the voltage of the power supply end of the adjust module; in response to the detection that the voltage is less than the predetermined voltage threshold, cut off the drive signal output from the drive circuit to the corresponding IGBT transistor; and in response to the detection that the voltage is greater than or equal to the predetermined voltage threshold, output a low impedance state and a high impedance state in a continuous alternating manner, to release the charge in the corresponding IGBT transistor, and control the drive circuit to output the drive signal to the corresponding IGBT transistor after the predetermined time.

In some embodiments, each adjust circuit includes a voltage detection module, a time delay module, an output module, a signal generator, and a first switch;

an input end of the voltage detection module, a power supply end of the time delay module, a power supply end of the signal generator, and a power supply end of the output module are connected to form the power supply end of the adjust circuit; an output end of the voltage detection module is respectively connected to a control end of the time delay module and a control end of the first switch; an output end of the time delay module is connected to a second control end of the output module; an output end of the signal generator is connected to a first control end of the output module; an input end of the output module is the signal input end of the adjust circuit; an output end of the output module is connected to an input end of the first switch; and an output end of the first switch is the signal output end of the adjust circuit;

in response to the detection that the voltage is less than the predetermined voltage threshold, the voltage detection module is configured to turn the first switch from an on state to an off state;

in response to the detection that the voltage is greater than or equal to the predetermined voltage threshold, the voltage detection module is configured to control the first switch to turn on and the time delay module to starting timing, and the signal generator is configured to control the output module to output the low impedance state and the high impedance state in the continuous alternating manner, to release the charge in the corresponding IGBT transistor; and in response to a determination that a timing reaches a predetermined time, the time delay module is configured to control the output module to output the drive circuit to the corresponding IGBT transistor through the output module.

In some embodiments, the output module includes a third switch, a first PMOS transistor, and a second NMOS transistor;

a control end of the third switch is the second control end of the output module; a first selection end of the third switch is the first control end of the output module; a second selection end of the third switch is connected to a gate of the first PMOS transistor; a fixed end of the third switch is connected to a gate of the second NMOS transistor; a source of the first PMOS transistor is connected to the positive electrode of the power supply end of the adjust circuit; a connection end of a drain of the first PMOS transistor and a drain of the second NMOS transistor is the output end of the output module; and a source of the second NMOS transistor is connected to the negative electrode of the power supply end of the adjust circuit.

In some embodiments, the adjust module is further configured to:

detect the voltage of the power supply end of the adjust module; in response to the detection that the voltage is less than the predetermined voltage threshold, cut off the drive signal output from the drive circuit to the corresponding IGBT transistor, and start timing; in response to a determination that a timing does not reach a predetermined target time, and the detection that the voltage is greater than or equal to the predetermined voltage threshold, release the charge in the corresponding IGBT transistor; and in response to a determination that the timing reaches the predetermined time, control the drive circuit to output the drive signal to the corresponding IGBT transistor.

In some embodiments, each of the adjust circuits includes a voltage detection module, a counting module, an output module, and a first switch;

an input end of the voltage detection module, a power supply end of the counting module, and a power supply end of the output module are connected to form the power supply end of the adjust circuit; an output end of the voltage detection module is respectively connected to an input end of the counting module and a control end of the first switch; an output end of the counting module is connected to a control end of the output module; an input end of the output module is the signal input end of the adjust circuit; an output end of the output module is connected to an input end of the first switch; and an output end of the first switch is the signal output end of the adjust circuit;

the voltage detection module is configured to, in response to the detection that the voltage of the input end of the adjust circuit is less than the predetermined voltage threshold, control the counting module to start timing, and turn the first switch from an on state in which the first switch is normally operated to an off state; and the counting module is configured to, at beginning of the timing, output a first trigger signal, to control the output module to output a low impedance state;

in response to the determination that a timing does not reach a predetermined time, and the detection that the voltage is greater than or equal to the predetermined voltage threshold, the low impedance state output from the output module is configured to release the charge in the corresponding IGBT transistor; and in response to the determination that the timing reaches the predetermined time, the counting module is configured to output a second trigger signal, to control the drive module to output the drive circuit to the corresponding IGBT transistor.

In some embodiments, the output module includes a second switch, a third switch, a first PMOS transistor, and a second NMOS transistor;

an input end of the second switch, a first selection end of the third switch, and a source of the first PMOS transistor are connected to the positive electrode of the power supply end of the adjust module; an output end of the second switch is connected to a control end of the third switch;

a second selection end of the third switch is connected to a gate of the first PMOS transistor; a fixed end of the third switch is connected to a gate of the second NMOS transistor; a connection end of a drain of the first PMOS transistor and a drain of the second NMOS transistor is the output end of the output module; and a source of the second NMOS transistor is connected to the negative electrode of the power supply end of the adjust circuit.

In some embodiments, the adjust module is further configured to:

detect the voltage of the power supply end of the adjust module; in response to the detection that the voltage is less than the predetermined voltage threshold, cut off the drive signal output from the drive circuit to the corresponding IGBT transistor, and start timing; in response to a determination that a timing does not reach a predetermined target time, and the detection that the voltage is greater than or equal to the predetermined voltage threshold, output a low impedance state and a high impedance state in a continuous alternating manner, to release the charge in the corresponding IGBT transistor; and in response to a determination that the timing reaches the predetermined target time, control the drive circuit to output the drive signal to the corresponding IGBT transistor.

In some embodiments, each of the adjust circuits includes a voltage detection module, a counting module, a signal generator, an output module, and a first switch;

an input end of the voltage detection module, a power supply end of the counting module, a power supply end of the signal generator, a power supply end of the output module are connected to form the power supply end of the adjust circuit; an output end of the voltage detection module is respectively connected to an input end of the counting module and a control end of the first switch; an output end of the counting module is connected to a first control end of the output module; an output end of the signal generator is connected to a second control end of the output module; an input end of the output module is the signal input end of the adjust circuit; an output end of the output module is connected to an input end of the first switch; and an output end of the first switch is the signal output end of the adjust circuit;

the voltage detection module is configured to, in response to the detection that the voltage of the input end of the adjust circuit is less than the predetermined voltage threshold, control the counting module to start timing, and turn the first switch from an on state in which the first switch is normally operated to an off state; and the counting module is configured to, at beginning of the timing, output a first trigger signal, and control, by using the first trigger signal combined with a pulse signal output from the signal generator, the output module to output a low impedance state and a high impedance state in a continuous alternating manner;

in response to the determination that a timing does not reach a predetermined time, and the detection that the voltage is greater than or equal to the predetermined voltage threshold, the low impedance state and the high impedance state in the continuous alternating manner output from the output module is configured to release the charge in the corresponding IGBT transistor; and in response to the determination that the timing reaches the predetermined time, the counting module is configured to output a second trigger signal, to control the drive module to output the drive circuit to the corresponding IGBT transistor.

In some embodiments, the output module includes a second switch, a third switch, a first PMOS transistor, and a second NMOS transistor; and, wherein:

an input end of the second switch and a source of the first PMOS transistor are respectively connected to the positive electrode of the power supply end of the adjust module; an output end of the second switch is connected to a control end of the third switch; a control end of the second switch is the first control end of the output module;

a first selection end of the third switch is the second control end of the output module;

a second selection end of the third switch is connected to a gate of the first PMOS transistor; a fixed end of the third switch is connected to a gate of the second NMOS transistor; a connection end of a drain of the first PMOS transistor and a drain of the second NMOS transistor is the output end of the output module; and a source of the second NMOS transistor is connected to the negative electrode of the power supply end of the adjust circuit.

In some embodiments, the adjust module is further configured to:

detect the voltage of the power supply end of the adjust module; in response to the detection that the voltage is less than the predetermined voltage threshold, cut off the drive signal output from the drive circuit to the corresponding IGBT transistor, and start timing; and in response to the detection that the voltage is larger than or equal to the predetermined voltage threshold, if the timing does not reach a first predetermined target time, output a low impedance state and a high impedance state in a continuous alternating manner, to release the charge in the corresponding IGBT transistor; if the timing exceeds the first predetermined target time but does not reach a second predetermined target time, output the low impedance state, to continue releasing the charge in the corresponding IGBT transistor; and if the timing reaches the second predetermined target time, control the drive circuit to output the drive signal to the corresponding IGBT transistor.

In some embodiments, each of the adjust circuits includes a voltage detection module, a counting module, a signal generator, an output module, and a first switch;

an input end of the voltage detection module, a power supply end of the counting module, a power supply end of the signal generator, a power supply end of the output module are connected to form the power supply end of the adjust circuit; an output end of the voltage detection module is respectively connected to an input end of the counting module and a control end of the first switch; a first output end of the counting module is connected to a first control end of the output module; a second output end of the counting module is connected to a second control end of the output module; an output end of the signal generator is connected to a third control end of the output module; an input end of the output module is the signal input end of the adjust circuit; an output end of the output module is connected to an input end of the first switch; and an output end of the first switch is the signal output end of the adjust circuit;

the voltage detection module is configured to, in response to the detection that the voltage of the input end of the adjust circuit is less than the predetermined voltage threshold, control the counting module to start timing, and turn the first switch from an on state in which the first switch is normally operated to an off state; and the counting module is configured to: at beginning of the timing, output a first trigger signal simultaneously through the first output end the second output end thereof, to control, by using the first trigger signal combined with a pulse signal output from the signal generator, the output module to output a low impedance state and a high impedance state in a continuous alternating manner; and in response to a determination that a timing exceeds a first target time but does not reach a second target time, output a second trigger signal through the second output end thereof, to control the output module to output the low impedance state;

in response to the detection that the voltage is larger than or equal to the predetermined voltage threshold, if the timing does not reach the first target time, the output module is configured to output the low impedance state and the high impedance state in the continuous alternating manner, to release the charge in the corresponding IGBT transistor; if the timing exceeds the first target time but does not reach the second target time, the output module is configured to output the low impedance state, to continue releasing the charge in the corresponding IGBT transistor; and if the timing reaches the second first target time, the counting module is configured to output a third trigger signal, to control the drive module to output the drive circuit to the corresponding IGBT transistor.

In some embodiments, the output module includes a second switch, a third switch, a fourth switch, a first PMOS transistor, and a second NMOS transistor;

an input end of the second switch, a second selection end of the third switch, and a source of the first PMOS transistor are respectively connected to the positive electrode of the power supply end of the adjust module; an output end of the second switch is connected to a control end of the fourth switch; a control end of the second switch is the first control end of the output module;

a control end of the third switch is the second control end of the output module; a first selection end of the third switch is a third control end of the output module; a fixed end of the third switch is connected to a first selection end of the fourth switch;

a second selection end of the fourth switch is connected to a gate of the first PMOS transistor; a fixed end of the fourth switch is connected to a gate of the second NMOS transistor; a connection end of a drain of the first PMOS transistor and a drain of the second NMOS transistor is the output end of the output module; and a source of the second NMOS transistor is connected to the negative electrode of the power supply end of the adjust circuit.

In some embodiments, the adjust module is further configured to:

detect the voltage of the power supply end the adjust module; in response to the detection that the voltage is less than the predetermined voltage threshold, cut off the drive signal output from the drive circuit to the corresponding IGBT transistor, and start timing; and in response to the detection that the voltage is larger than or equal to the predetermined voltage threshold, if a timing does not reach a first predetermined target time, output a low impedance state and a high impedance state in a continuous alternating manner with the low impedance state as a first duty cycle, to release the charge in the corresponding IGBT transistor; if the timing exceeds the first predetermined target time but does not reach a second predetermined target time, output the low impedance state and the high impedance state in the continuous alternating manner with the low impedance state as a second duty cycle, to release the charge in the corresponding IGBT transistor, wherein the first duty cycle is smaller than the second duty cycle; and if the timing reaches the second predetermined target time, control the drive circuit to output the drive signal to the corresponding IGBT transistor.

In some embodiments, each of the adjust circuits includes a voltage detection module, a counting module, a first signal generator, a second signal generator, an output module, and a first switch;

an input end of the voltage detection module, a power supply end of the counting module, a power supply end of the first signal generator, a power supply end of the second signal generator, and a power supply end of the output module are connected to form the power supply end of the adjust circuit; an output end of the voltage detection module is respectively connected to an input end of the counting module and a control end of the first switch; a first output end of the counting module is connected to a first control end of the output module; a second output end of the counting module is connected to a second control end of the output module; an output end of the first signal generator is connected to a third control end of the output module; an output end of the second signal generator is connected to a fourth control end of the output module; an input end of the output module is the signal input end of the adjust circuit, an output end of the output module is connected to an input end of the first switch, and an output end of the first switch is the signal output end of the adjust circuit;

the voltage detection module is configured to, in response to the detection that the voltage of the input end of the adjust circuit is less than the predetermined voltage threshold, control the counting module to start timing, and turn the first switch from an on state in which the first switch is normally operated to an off state; and the counting module is configured to, at beginning of the timing, output a first trigger signal simultaneously through the first output end the second output end thereof, to control, by using the first trigger signal combined with a pulse signal output from the first signal generator, the output module to output a low impedance state and a high impedance state in a continuous alternating manner with the low impedance state as a first duty cycle; and in response to a determination that a timing exceeds a first predetermined target time but does not reach a second predetermined target time, the counting module is configured to output a second trigger signal through the second output end thereof, to control, by using the second trigger signal combined with a pulse signal output from the second signal generator, the output module to output the low impedance state with the low impedance state as a second duty cycle;

in response to the detection that the voltage is larger than or equal to the predetermined voltage threshold, if the timing does not reach the first predetermined target time, the output module is configured to output the low impedance state and the high impedance state in the continuous alternating manner with the impedance state as the first duty cycle, to release the charge in the corresponding IGBT transistor; if the timing exceeds the first target time but does not reach the second target time, the output module is configured to output the low impedance state and the high impedance state in the continuous alternating manner with the impedance state as the second duty cycle, to continue releasing the charge in the corresponding IGBT transistor; and if the timing reaches the second first target time, the counting module is configured to output a third trigger signal, to control the drive module to output the drive circuit to the corresponding IGBT transistor.

In some embodiments, the output module includes a second switch, a third switch, a fourth switch, a first PMOS transistor, and a second NMOS transistor;

an input end of the second switch and a source of the first PMOS transistor are respectively connected to the positive electrode of the power supply end of the adjust module; an output end of the second switch is connected to a control end of the fourth switch; a control end of the second switch is the first control end of the output module;

a control end of the third switch is the second control end of the output module; a first selection end of the third switch is the third control end of the output module; a second selection end of the third switch is the fourth control end of the output module; a fixed end of the third switch is connected to a first selection end of the fourth switch;

a second selection end of the fourth switch is connected to a gate of the first PMOS transistor; a fixed end of the fourth switch is connected to a gate of the second NMOS transistor; a connection end of a drain of the first PMOS transistor and a drain of the second NMOS transistor is the output end of the output module; and a source of the second NMOS transistor is connected to the negative electrode of the power supply end of the adjust circuit.

In another aspect, the present disclosure provides a controller for an air conditioner, including any of the above-mentioned intelligent power modules.

In the IPM module according to the present disclosure, an adjust circuit is additionally provided between each of the drive circuits and the corresponding IGBT transistor. The adjust circuit can detect a change in the voltage of the low voltage power supply of the IPM module in real time, and disable the output of the module when the voltage is detected to be too low due to the fluctuation of the low voltage power supply. In response to stored electronic energy of the drive motor causing charge accumulation of the IGBT transistor, the adjust circuit first cuts off the drive output and the drive signal of the IGBT transistor, in order to naturally release the charge accumulated in the IGBT transistor. When the low voltage power supply is restored to normal, the output module outputs the low impedance state, to continue releasing the charge accumulated in the IGBT transistor. After the predetermined time, the adjust circuit resumes normal transmission from the input end to the output end, and accordingly the drive signal output from the drive circuit can normally control the corresponding IGBT transistor. Because the charge accumulated in the IGBT transistor has been completely released, the normal operation of the module can be ensured, thereby preventing the operating reliability of the module from being affected by the impact of the accumulated charge.

DETAILED DESCRIPTION OF THE EMBODIMENTS

Figure 1:
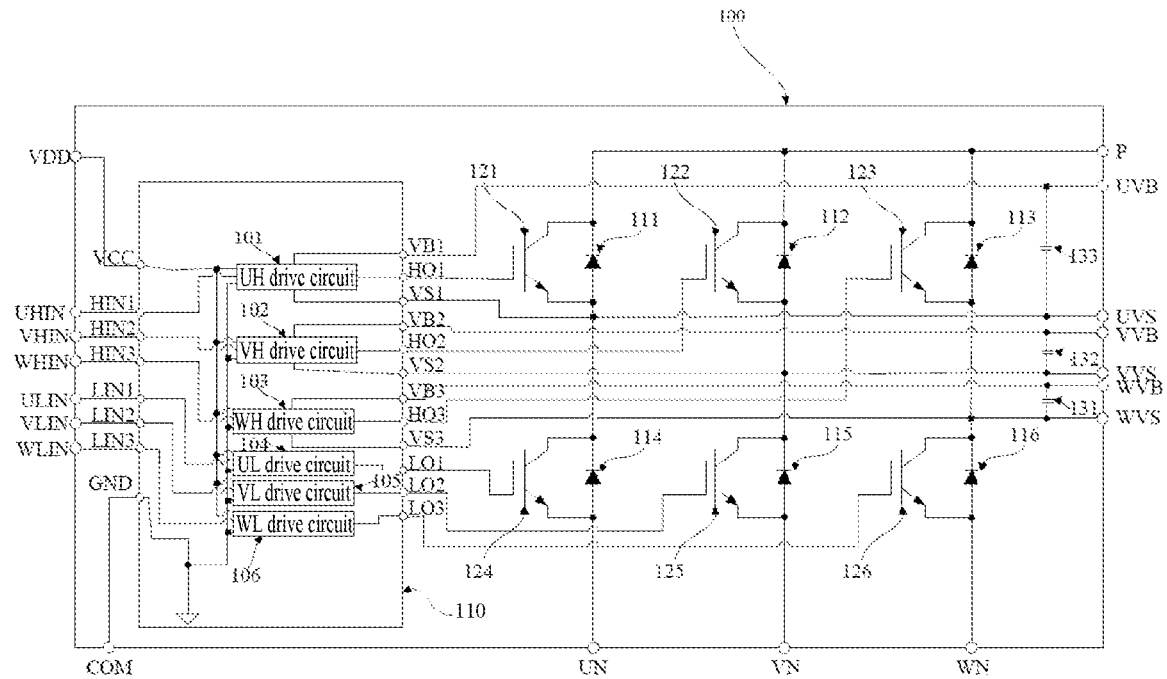
FIG. 1 is a circuit structure diagram of an intelligent power module in the related art.
Figure 2:
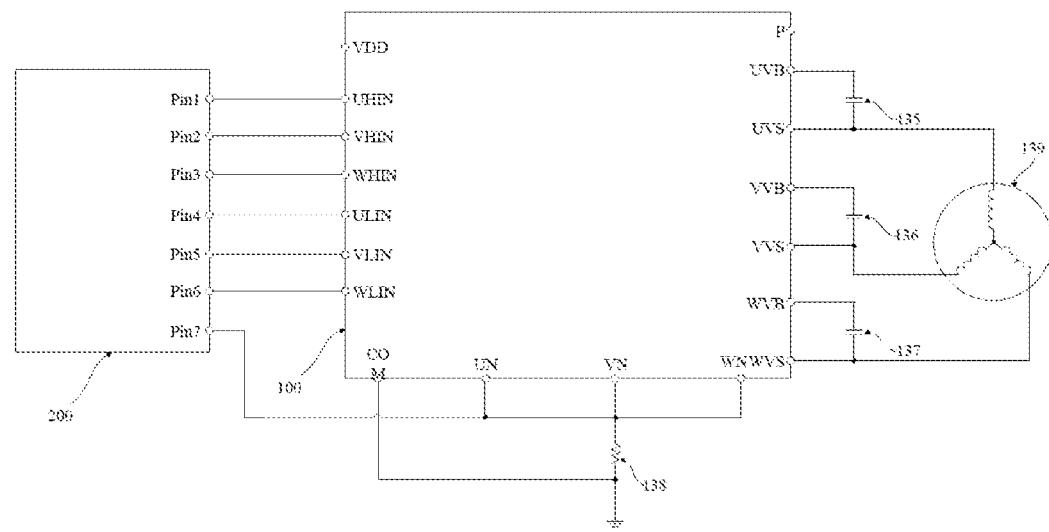
FIG. 2 is a circuit diagram of the intelligent power module in the related art when the intelligent power module is being operated.

Hereinafter, embodiments of the present disclosure will be described in detail. Embodiments are shown in the drawings, wherein the same or similar reference numerals indicate the same or similar elements having the same or similar functions. The embodiments described below with reference to the drawings are exemplary and are intended to explain the present disclosure, but should not be construed as limiting the present disclosure.

Figure 3:
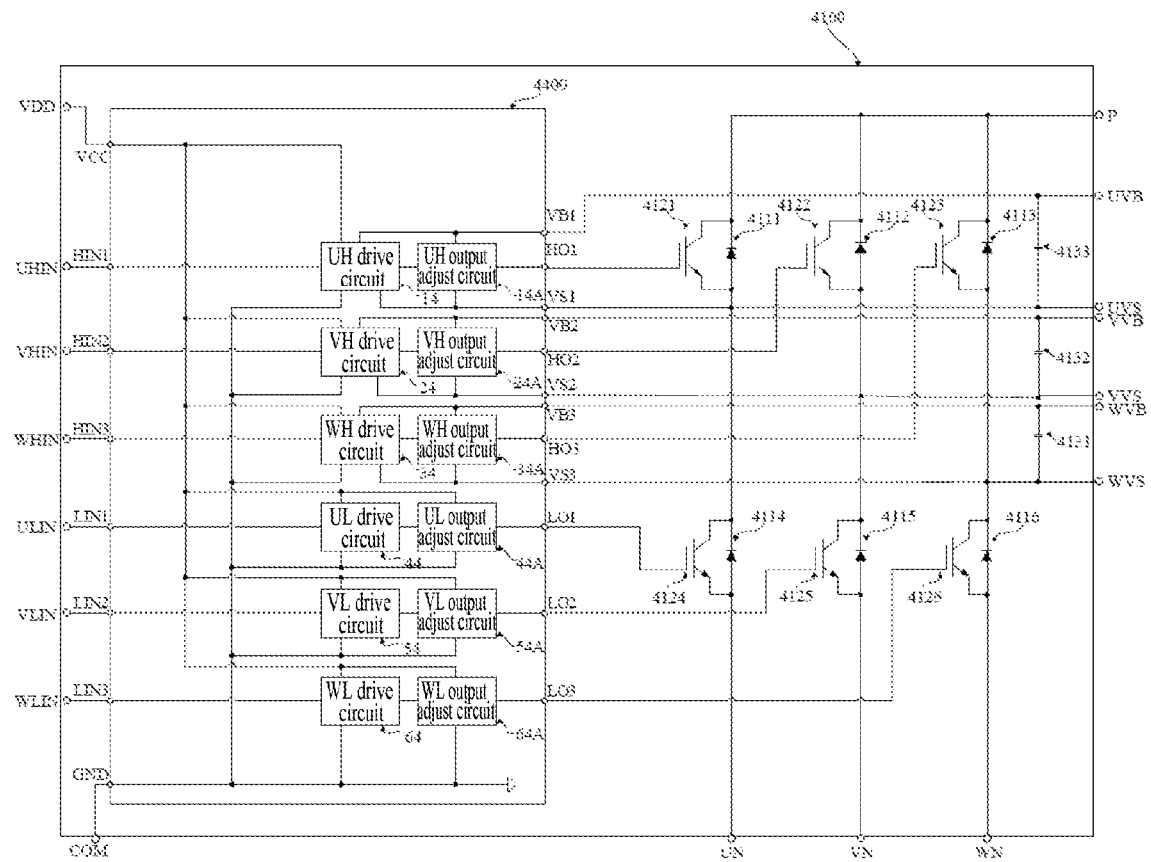
FIG. 3 is a circuit structure diagram of an intelligent power module according to an exemplary embodiment of the present disclosure.

Referring to FIG. 3, a structure diagram of an IPM module 4100 according to a first embodiment of the present disclosure is illustrated. For brevity and readily description, only parts related to the embodiment of the present disclosure are shown, which should not be considered and/or interpreted as limiting in any sense.

In this embodiment, the IPM module 4100 includes three-phase upper bridge arm IGBT transistors, three-phase lower bridge arm IGBT transistors, and drive circuits and adjust circuits. Each one of the three-phase upper bridge arm IGBT transistors and the three-phase lower bridge arm IGBT transistors has a corresponding drive circuit and a corresponding adjust circuit.

The output end of a drive circuit is connected to the signal input end of a corresponding adjust circuit, and the signal output end of the corresponding adjust circuit is connected to the gate of a corresponding IGBT transistor.

The positive and negative electrodes of the power supply end of the adjust circuit, corresponding to each of the three-phase upper bridge arm IGBT transistors, are respectively connected to the positive and negative electrodes of a power supply of the high voltage region of a corresponding phase. The positive and negative electrodes of the power supply end of the adjust circuit corresponding to each of the three-phase lower bridge arm IGBT transistors are respectively connected to the positive and negative electrodes of a power supply of the low voltage region of the intelligent power module.

The adjust circuit is configured to detect the power supply of the low voltage region of the IPM module. In addition, when the voltage of the power supply drops, the adjust circuit is configured to release charge accumulated in the IGBT transistor inside the IPM module; and when the voltage of the power supply is increased back to normal, the adjust circuit is configured to completely release the remaining charge, so as to prevent the operating reliability of the IPM module from being affected by the impact of the charge on internal circuits of the IPM module.

For example, the adjust circuit is configured to detect the voltage of the power supply end thereof. In response to a determination that the voltage is less than a predetermined voltage threshold, the adjust circuit cuts off the drive signal output from the drive circuit to the corresponding IGBT transistor. In response to a determination that the voltage is greater than or equal to the predetermined voltage threshold, the adjust circuit releases the charge in the corresponding IGBT transistor, and controls the drive circuit to output the drive signal to the corresponding IGBT transistor after a predetermined time.

In this embodiment, the three-phase upper bridge arm IGBT transistors include a U-phase upper bridge arm IGBT transistor 4121, a V-phase upper bridge arm IGBT transistor 4122, and a W-phase upper bridge arm IGBT transistor 4123, respectively. The three-phase lower bridge arm IGBT transistors are a U-phase lower bridge arm IGBT transistor 4124, a V-phase lower bridge arm IGBT transistor 4125, and a W-phase lower bridge arm IGBT transistor 4126, respectively. The six IGBT transistors respectively form power circuits corresponding to the three-phase upper bridge arms and the three-phase lower bridge arms of the IPM module, for the purpose of supplying corresponding three-phase currents and voltages so as for the IPM module to drive a load motor. Further, the power circuit of each bridge arm may also include a fast recovery diode (hereinafter "FRD") connected in parallel with each IGBT transistor, to supply a reverse voltage flyback for the corresponding IGBT transistor, thereby functioning in a protective role.

In this embodiment, the drive circuits and the adjust circuits, each corresponding to each one of the three-phase upper bridge arm IGBT transistors and the three-phase lower bridge arm IGBT transistors, include:

a UH output adjust circuit 14A connected to the U-phase upper bridge arm IGBT transistor 4121, and a UH drive circuit 14 connected to the UH output adjust circuit 14A;

a VH output adjust circuit 24A connected to the V-phase upper bridge arm IGBT transistor 4122, and a VH drive circuit 24 connected to the VH output adjust circuit 24A;

a WH output adjust circuit 34A connected to the W-phase upper bridge arm IGBT transistor 4123, and a WH drive circuit 34 connected to the WH output adjust circuit 34A;

a UL output adjust circuit 44A connected to the U-phase lower bridge arm IGBT transistor 4124, and a UL drive circuit 44 connected to the UL output adjust circuit 44A;

a WL output adjust circuit MA connected to the W-phase lower bridge arm IGBT transistor 4125, and a WL drive circuit 54 connected to the WL output adjust circuit 54A; and a VL output adjust circuit 64A connected to the V-phase lower bridge arm IGBT transistor 4126, and a VL drive circuit 64 connected to the VL output adjust circuit 64A.

In this embodiment, the above six drive circuits and adjust circuits are integrated in a high voltage integrated circuit (HVIC) transistor 4400, as shown in FIG. 3. In application, these six drive circuits and adjust circuits may be independently arranged. Alternatively or optionally, the three drive circuits and adjust circuits corresponding to the upper bridge arms are integrated in an HVIC transistor, and the three drive circuits and adjust circuits corresponding to the lower bridge arms are integrated in a low voltage integrated circuit (LVIC) transistor. The specific arranging manners may vary with different internal structures of the IPM module.

In this embodiment, the positive electrode VCC of the power supply of the HVIC transistor 4400 is configured as the positive electrode VDD of the power supply of the low voltage region of the intelligent power module 4100. Typically, the VDD is 15V. The negative electrode GND of the power supply of the HVIC transistor 4400 is configured as the negative electrode COM of the power supply of the low voltage region of the intelligent power module 4100. The power supply of the high voltage region of the corresponding phase has a high voltage due to the connection with a DC bus voltage. For example, the DC bus voltage connected through the P end is generally about 300V.

The first input end HIN1 of the HVIC transistor 4400 is configured as the U-phase upper bridge arm input end UHIN of the intelligent power module 4100, and is connected to the input end of the UH drive circuit 14.

The second input end HIN2 of the HVIC transistor 4400 is configured as the V-phase upper bridge arm input end VHIN of the intelligent power module 4100, and is connected to the input end of the VH drive circuit 24.

The third input end HIN3 of the HVIC transistor 4400 is configured as the W-phase upper bridge arm input end WHIN of the intelligent power module 4100, and is connected to the input end of the WH drive circuit 34.

The fourth input end LIN1 of the HVIC transistor 4400 is configured as the U-phase lower bridge arm input end ULIN of the intelligent power module 4100, and is connected to the input end of the UL drive circuit 44.

The fifth input end LIN2 of the HVIC transistor 4400 is configured as the V-phase lower bridge arm input end VLIN of the intelligent power module 4100, and is connected to the input end of the VL drive circuit 54.

The sixth input end LIN3 of the HVIC transistor 4400 is configured as the W-phase lower bridge arm input end WLIN of the intelligent power module 4100, and is connected to the input end of the WL drive circuit 64.

The power supplies of the UL drive circuit 44, the WL drive circuit 54, and the VL drive circuit 64 are the power supply of the low voltage region of the intelligent power module 4100. The power inputs of the UL output adjust circuit 44A, the WL output adjust circuit 54A, and the VL output adjust circuit 64A are the same with them.

The UH drive circuit 14, the VH drive circuit 24, and the WH drive circuit 34 have two power supplies. One is the power supply of the low voltage region of the intelligent power module 4100, and the other one is the power supply of the high voltage region of the corresponding phase. The power inputs of the UH output adjust circuit 14A, the VH output adjust circuit 24A, and the WH output adjust circuit 34A are the same as the power supplies of the high voltage region of the corresponding drive circuits. That is, the power inputs of the UH drive circuit 14 and the UH output adjust circuit 14A are the U-phase high voltage power supplies UVB and UVS; the power inputs of the VH drive circuit 24 and the VH output adjust circuit 24A are the V-phase high voltage power supplies VVB and VVS; the power inputs of the WH drive circuit 34 and the WH output adjust circuit 34A are the V-phase high voltage power supplies WVB and WVS.

In this embodiment, the input end P of the DC bus voltage of the IPM module 4100 is respectively connected to the collectors of the above six IGBT transistors, where UN, VN, and WN are respectively the emitters of the three lower bridge arm IGBT transistors. The IPM module 4100 further includes three bootstrap capacitors 4133, 4132, and 4131 that are respectively connected in parallel with the power supply ends of the high voltage region of the corresponding phases.

During the normal operation of the IPM module 4100, only one of the upper and lower bridge arm input signals of the same phase in the six input signals of UHIN, VHIN, WHIN, ULIN, VLIN, and WLIN is at a high level, and the other one is at a low level. That is, only one of the UHIN and ULIN is at the high level, only one of the VHIN and VLIN is at the high level, only one of the WHIN and WLIN is at the high level.

Taking the upper bridge arm input signal UHIN and the lower bridge arm input signal ULIN for example, when the UHIN is at the low level, the ULIN must be at the high level. At this time, the UHIN is output to the gate of the U-phase upper bridge arm IGBT transistor 4121 through the UH drive circuit 14 and the UH output adjust circuit 14A, to turn off the U-phase upper bridge arm IGBT transistor 4121. The ULIN is an output to the gate of the U-phase lower bridge arm IGBT transistor 4124 through the UL drive circuit 44 and the UL output adjust circuit 44A, to turn on the U-phase lower bridge arm IGBT transistor 4124. In addition, the power supply VDD of the low voltage region of the IPM module 4100 charges the bootstrap capacitor 4133 through an internal bootstrap circuit of the UH drive circuit 14. In this case, the charging circuit runs through the VDD, through the internal of the UH drive circuit 14, through the UVB, through the bootstrap capacitor 4133, through the U-phase lower bridge arm IGBT 4124, to the negative electrode COM of the power supply of the low voltage region. After a sufficient time, the voltage of the capacitor is close to the voltage of the power supply of the voltage region, namely 15V. That is, the voltage of the U-phase high voltage power supply UVB relative to the UVS is close to 15V. In addition, when the UHIN is at the high level, the ULIN must be at the low level. At this time, the U-phase upper bridge arm IGBT transistor 4121 is turned on, while the U-phase lower bridge arm IGBT transistor 4124 is turned off. The voltage of the UVS after the DC bus voltage passing through the end P and the U-phase upper bridge arm IGBT transistor 4121 is close to 300V, and the voltage of the bootstrap capacitor 4133 is close to 15V; thus, the voltage of the UVB is raised to close to 315V. The voltages of the U-phase high voltage power supplies UVB and UVS vary with the U-phase upper and lower bridge arm input signals UHIN and ULIN. If the high-level signal input by the U-phase upper bridge arm is relatively short and the charge stored in the bootstrap capacitor 4133 is relatively large, the voltage of the UVB relative to the UVS can be maintained above 14V. That is, the voltage of the power supply of the high voltage region of the UH output adjust circuit 14A and the UH drive circuit 14 can be maintained above 14V.

Similarly, the power supplies of the high voltage region of the other phases may also be maintained above 14V.

Figure 4:
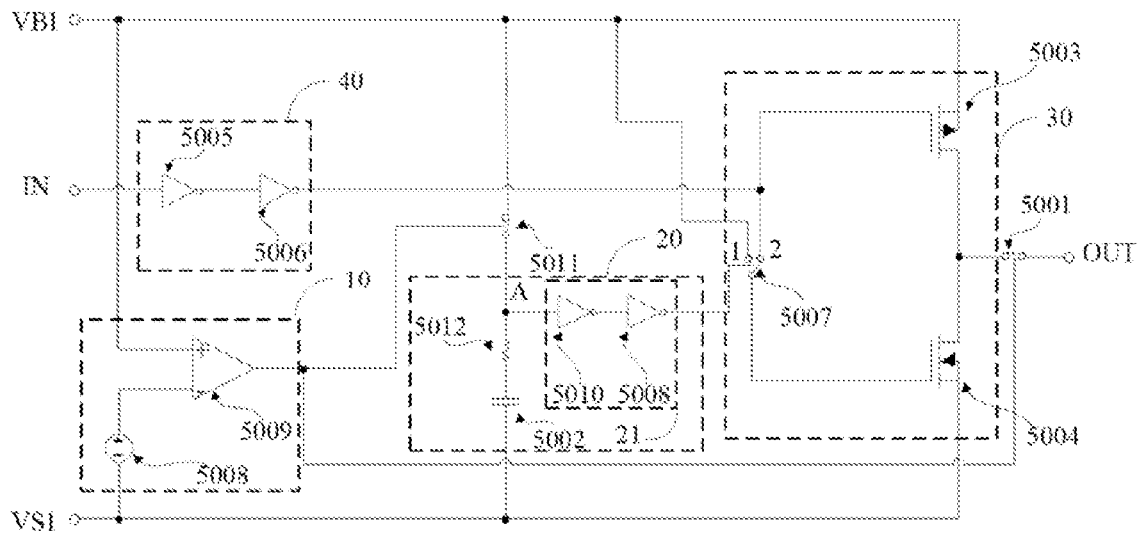
FIG. 4 is a detailed circuit structure diagram of an output adjust circuit in FIG. 3.

In this embodiment, each adjust circuit includes a voltage detection module, a time delay module, an output module, and a first switch. Taking the UH output adjust circuit 14A for example, as shown in FIG. 4, the UH output adjust circuit 14A includes a voltage detection module 10, a time delay module 20, an output module 30, and a first switch 5001.

The input end of the voltage detection module 10, the power supply end of the time delay module 20, and the power supply end of the output module 30 are connected to form the power supply end of the adjust circuit. The output end of the voltage detection module 10 is respectively connected to the control end of the time delay module 20 and the control end of the first switch 5001. The output end of the time delay module 20 is connected to the control end of the output module 30. The input end of the output module 30 is the signal input end IN of the adjust circuit, and the output end of the output module 30 is connected to the input end of the first switch 5001. The output end of the first switch 5001 is the signal output end OUT of the adjust circuit.

In response to the voltage of the input end of the adjust circuit being less than the predetermined voltage threshold, the voltage detection module 10 turns the first switch 5001 from the on state to the off state.

In response to the voltage of the input end of the adjust circuit being larger than or equal to the predetermined voltage threshold, the voltage detection module 10 controls the first switch 5001 to turn on and the time delay module 20 to start timing, and controls the output module 30 to release the charge in the corresponding IGBT transistor through the time delay module 20. In response to the timing reaching a predetermined time, the time delay module 20 controls the drive circuit to output the drive signal to the corresponding IGBT transistor through the output module 30.

For example, the voltage detection module 10 includes a comparator 5009 and a voltage source 5008.

The non-inverting end of the comparator 5009 is the positive electrode VB1 of the input end of the voltage detection module 5008. The positive electrode of the output end of the voltage source 5008 is connected to the inverting end of the comparator 5009, and the negative electrode of the output end of the voltage source 5008 is the negative electrode VS1 of the input end of the voltage detection module 10. The voltage source 5008 is configured to supply a stable reference voltage for the inverting end of the comparator 5009. The voltage source 5008 may be selected to be 6V or a voltage that is 1V to 2V lower than the under voltage protection of the IPM module 4100.

The time delay module 20 includes a second switch 5011, a first resistor 5012, and a first capacitor 5002.

The control end of the second switch 5011 is the control end of the time delay module 20. The input end of the second switch 5011 is connected to the positive electrode VB1 of the power supply end of the adjust circuit. The connection end, where the output end of the second switch 5011 and one end of the first resistor 5012 are connected, is the output end of the time delay module 20. The other end of the first resistor 5012 is connected to one end of the first capacitor 5002. The other end of the first capacitor 5002 is connected to the negative electrode VS1 of the power supply end of the adjust circuit.

The output module 30 includes a third switch 5007, a first PMOS transistor 5003, and a second NMOS transistor 5004.

The control end of the third switch 5007 is the control end of the output module 30. The first selection end of the third switch 5007 is connected to the positive electrode VB1 of the power supply end of the adjust circuit. The second selection end of the third switch 5007 is connected to the gate of the first PMOS transistor 5003. The fixed end of the third switch 5007 is connected to the gate of the second NMOS transistor 5004, the source of the first PMOS transistor 5003 is the positive electrode VB1 of the power supply of the output module 30. The connection end, where the drain of the first PMOS transistor 5003 and the drain of the second NMOS transistor 5004 are connected, is the output end of the output module 30. The source of the second NMOS transistor 5004 is connected to the negative electrode VS1 of the power supply end of the adjust circuit.

The operating principle of the adjust circuit in this embodiment is as follows: during the normal operation of the IPM module 4100, the six input signals can be driven and amplified through the corresponding drive circuits, then output to the gates of the IGBT transistors of the corresponding bridge arms through the adjust circuits, so as to control the switching states of the IGBT transistors; and finally, corresponding three-phase drive signals are output for driving the motor. However, since the IPM module 4100 works in a non-ideal environment, the power supply is unstable, which may cause a fluctuation of the low-voltage power supply VDD of the IPM module 4100. In the case where the VDD is lower than the under voltage protection value of the IPM module 4100, the drive module cannot be normally operated and accordingly cuts off the drive signal, so that the output of the IPM module 4100 is suddenly disabled. Because the drive motor is an inductive load, the internal winding thereof will store energy to generate induced potential, and the induced potential will be transmitted to the IPM module 4100, causing charge accumulation of the IGBT transistors of the IPM module 4100. The adjust circuit connected to the IGBT transistor is effective in releasing the charge accumulated in the IGBT transistor, the details of which will be described as follows.

When the voltage detection module 10 detects that the voltage of the input end of the adjust circuit is less than the predetermined voltage threshold (for example, when the voltage of the non-inverting end of the comparator 5009 is lower than the voltage of the voltage source 5008 connected to the inverting end), the voltage detection module 10 outputs a first control signal (namely a low-level signal) to the control end of the second switch 5011 and the control end of the first switch 5001 through the output end of the comparator 5009, so as to turn the two switches from the on state in which the switches are normally operated to the off state.

In response to the second switch 5011 being turned off, the output end of the output module 30 is disconnected from the output end OUT of the adjust circuit. At this time, the adjust circuit cuts off the drive signal output from the drive circuit to the corresponding IGBT transistor, that is, disables the output end OUT of the adjust circuit. In response to this, the charge accumulated in the IGBT transistor is to be naturally released.

In response to the second switch 5011 being turned off, the first capacitor 5012 quickly discharges through the first resistor 5002, and outputs a low-level second control signal to the control end of the third switch 5007, so as to connect the fixed end of the third switch 5007 to the first selection end. At this time, the positive electrode of the power supply of the adjust circuit is loaded on the gate of the second NMOS transistor 5004, so that the second NMOS transistor 5004 is turned on.

When the voltage detection module 10 detects that the voltage of the input end of the adjust circuit is greater than or equal to the predetermined voltage threshold (such as, when the voltage of the non-inverting end of the comparator 5009 is larger than or equal to the voltage of the voltage source 5008 connected to the inverting end), the voltage detection module 10 outputs a third control signal, namely a high-level signal, to the control end of the second switch 5011 and the control end of the first switch 5001 through the output end of the comparator 5009, so as to turn the two switches from the off state to the on state.

In response to the first switch 5001 being turned on, since the second NMOS transistor 5004 has already been in the on state, the output module 30 outputs a low impedance state, and at this time the charge accumulated in the IGBT transistor is continued to be released through the second NMOS transistor 5004, during which the charge is released faster than when it is naturally released.

In response to the second switch 5011 being turned on, the power supply VB1 of the adjust circuit charges the first capacitor 5002 through the second switch 5011 and the first resistor 5012. After the predetermined time elapses, the voltage of the first capacitor 5002 rises to a high level, and at this time the adjust circuit outputs a fourth control signal, so that the fixed end of the third switch 5007 is connected to the second selection end, and the adjust circuit controls the drive circuit to output the drive signal to the corresponding IGBT transistor through the output module 30, thereby resuming normal transmission from the input end IN to the output end OUT of the adjust circuit, namely the IPM module 4100 is back to normal. Since the charge accumulated in the IGBT transistor is completely released after the predetermined time, the IPM module 4100 can be ensured to resume normal operation.

It should be noted that when detecting a low voltage due to the fluctuation of the low voltage power supply, namely the VDD, the adjust circuit first turns off the first switch 5001, in order to naturally release the charge accumulated in the corresponding IGBT transistor, rather than directly controls the second NMOS transistor 5004 to release the charge. Because more charge is currently accumulated in the IGBT transistor, the releasing through the second NMOS transistor 5004 may produce a large releasing current, thereby causing excessive heat accumulation in the second NMOS transistor 5004 and possibly even damage to the second NMOS transistor 5004. Therefore, by turning off the first switch 5001 for naturally releasing the charge accumulated in the IGBT transistor, the releasing has been undergone for a while when the low voltage power supply is back to normal. The charge may be completely or incompletely released, which is determined according to the time from a moment when the voltage of the low voltage power supply drops to another moment when it resumes normal state. And by turning on the second NMOS transistor to continue releasing the charge, the charge can be ensued to be completely released. In addition, the adjust circuit resumes normal operation after the predetermined time, which is advantageous for the operating reliability of the IPM module 4100.

The first resistor 5012 and the first capacitor 5002 corresponding to the time delay module 20 may be selected as follows:

the high level of the first capacitor after being charged is selected with 7.5V, and the time parameter Tx is selected with 1 µs, then:

$$Vth = V_{BS} \cdot \left(1 - e^{-\frac{Tx}{RC}}\right); \text{ obtaining: } RC = \frac{10^{-6}}{0.693}$$

According to the above formula, the first capacitor 5002 may be selected with a capacitance of 10 pF, and the first resistor 5012 may be selected with a impedance of 144 kΩ to satisfy the requirements.

The above is related to the UH output adjust circuit 14A, and the other output adjust circuits have a similar operating principle. It should be noted that the power supplies of the UH output adjust circuit 14A, the VH output adjust circuit 24A, and the WH output adjust circuit 34A are the power supplies of the high voltage region of the corresponding phases. The power supply voltages are variable relative to the COM end of the low voltage region, but the voltages of the positive electrodes relative to the negative electrodes of the power supplies, namely the input voltages, remain unchanged during the normal operation of the IPM module 4100. The power supplies of the UL output adjust circuit 44A, the WL output adjust circuit 54A, and the VL output adjust circuit 64A are the power supply of the low voltage region of the IPM module 4100, and the voltage is nearly the same as the voltages of the positive electrodes relative to the negative electrodes of the power supplies of the high voltage region. When the low voltage power supply VDD of the IPM module 4100 fluctuates, since the charging for the three bootstrap capacitors will fluctuate with it, the voltages of the positive electrodes relative to the negative electrodes of the power supplies of the high voltage region will also fluctuate, so that the voltages are nearly the same as the voltage of the low voltage region.

In the IPM module 4100 according to this embodiment, an adjust circuit is additionally provided between each of the drive circuits and the corresponding IGBT transistor. The adjust circuit can detect a change in the voltage of the low voltage power supply of the IPM module 4100 in real time, and disable the output of the module when the voltage is detected to be too low due to the fluctuation of the low voltage power supply. In response to stored electronic energy of the drive motor causing charge accumulation of the IGBT transistor, the adjust circuit first cuts off the drive output and the drive signal of the IGBT transistor, in order to naturally release the charge accumulated in the IGBT transistor. When the low voltage power supply is restored to normal, the output module outputs the low impedance state, to continue releasing the charge accumulated in the IGBT transistor. After the predetermined time, the adjust circuit resumes the normal transmission from the input end to the output end, so that the drive signal output from the drive circuit can normally control the corresponding IGBT transistor. Because the charge accumulated in the IGBT transistor has been completely released, the normal operation of the module can be ensured, thereby preventing the operating reliability of the module from being affected by the impact of the accumulated charge.

Further, based on the first embodiment of the intelligent power module, in a second embodiment of an intelligent power module, as shown in FIG. 4, each adjust circuit further includes a shaping and amplifying module. Taking the UH output adjust circuit 14A for example, the UH output adjust circuit 14A further includes a shaping and amplifying module 40.

The input end of the shaping and amplifying module 40 is connected to the input end of the adjust circuit, the output end of the shaping and amplifying module 40 is connected to the second selection end of third switch 5007. The shaping and amplifying module 40 is configured to amplify and shape a signal of the input end of the adjust circuit, and then output the amplified and shaped signal to the second selection end of the third switch 5007.

For example, the shaping and amplifying module 40 includes a third NOT gate 5005 and a fourth NOT gate 5006.

The input end of the third NOT gate 5005 is the input end of the shaping and amplifying module 40, the output end of the third NOT gate 5005 is connected to the input end of the fourth NOT gate 5006, and the output end of the fourth NOT gate 5006 is the output end of the shaping and amplifying module 40.

During the normal operation of the IPM module 4100, the signal of the input end IN of the adjust circuit is amplified and shaped through the third NOT gate 5005 and the fourth NOT gate 5006, and then output after power driving of the first PMOS transistor 5003 and the second NMOS of the output module 30.

Further, the MOS transistor in the third NOT gate 5005 may have a different size with the MOS transistor in the fourth NOT gate 5006. The size of the MOS transistor in the third NOT gate 5005 is smaller than that in the fourth NOT gate 5006. Because the signal is strengthened after passing through the third NOT gate, the device power will be increased when the fourth NOT gate 5006 amplifies the signal, and the size of the MOS transistor therein may be larger than that in the third NOT gate 5005. For example, the size of the MOS transistor in the third NOT gate 5005 is designed to be half the size of the MOS transistor in the fourth NOT gate 5006.

Further, based on the first embodiment of the intelligent power module, in a third embodiment of an intelligent power module, as shown in FIG. 4, the time delay module 20 further includes a shaping unit 21.

The connection end, where the output end of the second switch 5011 and one end of the first resistor 5012 are connected, is the input end of the shaping unit 21. The output end of the shaping unit 21 is the output end of the time delay module 20. The shaping unit 21 is configured to shape the control signal output by the time delay module 20 and then output the shaped control signal to the control end of the output module 30.

For example, the shaping unit 21 includes a first NOT gate 5010 and a second NOT gate 5008.

The input end of the first NOT gate 5010 is the input end of the shaping unit 21, the output end of the first NOT gate 5010 is connected to the input end of the second NOT gate 5008, and the output end of the second NOT gate 5008 is the output end of the shaping unit 21.

The first NOT gate 5010 and the second NOT gate 5008 are configured to shape the voltage of the first capacitor 5002 in the time delay module 20 and then output the shaped voltage to the control end of the third switch 5007. In addition, since the conversion of the signal output from the NOT gate has a requirement for the input signal threshold, thus there also exists a requirement for the input voltage of the first capacitor 5002. Only when the threshold is reached, the output of the NOT gate is to be converted, thus the output of the next NOT gate can be guaranteed to be consistent with the input of the first stage NOT gate. For example, the input threshold Vth of the first NOT gate 5010 may be selected with 7.5V, and based on this the parameters of the first capacitor 5002 and the first resistor 5012 can be determined.

Figure 5:
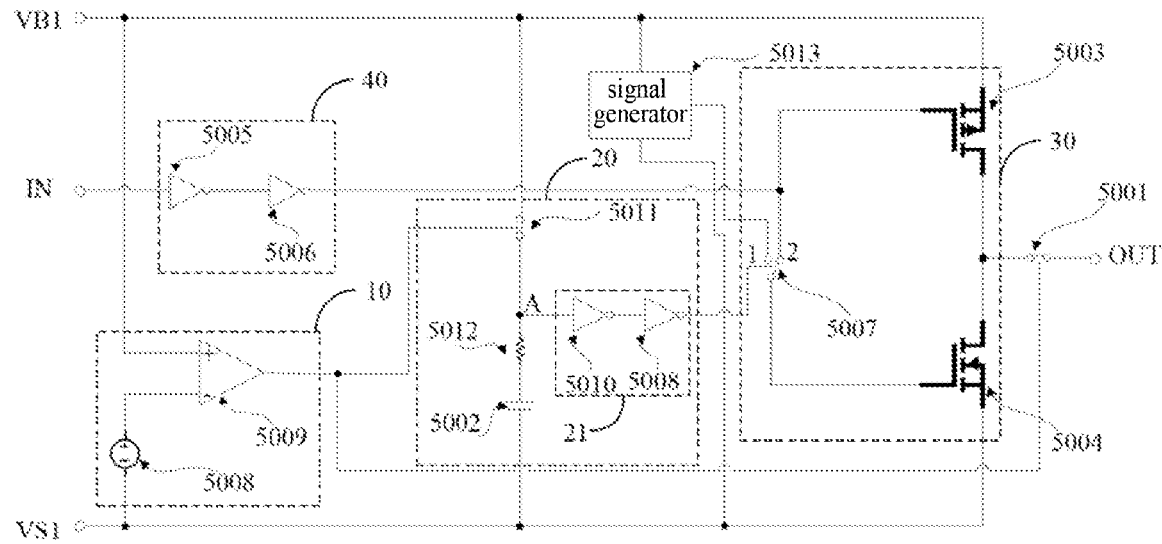
FIG. 5 is a detailed circuit structure diagram of an output adjust circuit in an intelligent power module according to another exemplary embodiment of the present disclosure.

Further, based on the first embodiment of the intelligent power module, in a fourth embodiment of the intelligent power module as shown in FIG. 5, the adjust circuit is further configured to:

detect the voltage of the power supply end thereof; in response to the determination that the voltage is less than the predetermined voltage threshold, cut off the drive signal output from the drive circuit to the corresponding IGBT transistor; and in response to the determination that the voltage is larger than or equal to the predetermined voltage threshold, output the low impedance state and the high impedance state in a continuous alternating manner, so as to release the charge in the corresponding IGBT transistor, and after a predetermined time, control the drive circuit to output the drive signal to the corresponding IGBT transistor.

In this embodiment, each adjust circuit includes a voltage detection module, a time delay module, an output module, a first switch, a second switch, and a third switch. Taking the UH output adjust circuit 14A for example, as shown in FIG. 5, the UH output adjust circuit 14A includes a voltage detection module 10, a time delay module 20, an output module 30, a signal generator 5013, and a first switch 5001.

The input end of the voltage detection module 10, the power supply end of the time delay module 20, the power supply end of the signal generator 5013, and the power supply end of the output module 30 are connected to form the power supply end of the adjust circuit. The output end of the voltage detection module 10 is connected to the control end of the time delay module 20 and the control end of the first switch 5001. The output end of the time delay module 20 is connected to the second control end of the output module 30. The output end of the signal generator 5013 is connected to the first control end of the output module 30. The input end of the output module 30 is the signal input end IN of the adjust circuit, the output end of the output module 30 is connected to the input end of the first switch 5001. The output end of the first switch 5001 is the signal output end OUT of the adjust circuit.

When the voltage detection module 10 detects the voltage of the input end of the adjust circuit being less than the predetermined voltage threshold, the voltage detection module 10 turns the first switch 5001 from the on state to the off state.

When the voltage detection module 10 detects the voltage of the input end of the adjust circuit being greater than or equal to the predetermined voltage threshold, the adjust circuit controls the first switch 5001 to turn on and the time delay module 20 to start timing; and controls the output module 30 to output a low impedance state and a high impedance state in a continuous alternating manner by the signal generator 5013, so as to release the charge in the corresponding IGBT transistor; and controls, in response to that a timing reaches a predetermined time, the drive circuit to output the drive signal to the corresponding IGBT transistor through the output module 30.

For example, the voltage detection module 10 includes a comparator 5009 and a voltage source 5008.

The non-inverting end of the comparator 5009 is connected to the positive electrode VB1 of the power supply end of the adjust circuit. The positive electrode of the output end of the voltage source 5008 is connected to the inverting end of the comparator 5009, and the negative electrode of the voltage source 5008 is connected to the negative electrode VS1 of the power supply end of the adjust circuit. The voltage source 5008 is configured to supply a stable reference voltage for the inverting end of the comparator 5009. The voltage source 5008 may be selected with 6V or a voltage that is 1V to 2V lower than the under voltage protection of the IPM module 4100.

The time delay module 20 includes a second switch 5011, a first resistor 5012, and a first capacitor 5002.

The control end of the second switch 5011 is the control end of the time delay module 20. The input end of the second switch 5011 is connected to the positive electrode VB1 of the power supply end of the adjust circuit. The connection end, wherein the output end of the second switch 5011 and one end of the first resistor 5012 are connected, is the output end of the time delay module 20. The other end of the first resistor 5012 is connected to one end of the first capacitor 5002. The other end of the first capacitor 5002 is connected to the negative electrode VS1 of the power supply end of the adjust circuit.

The output module 30 includes a third switch 5007, a first PMOS transistor 5003, and a second NMOS transistor 5004.

The control end of the third switch 5007 is the second control end of the output module 30. The first selection end of the third switch 5007 is the first control end of the output module 30. The second selection end of the third switch 5007 is connected to the gate of the first PMOS transistor 5003. The fixed end of the third switch 5007 is connected to the gate of the second NMOS transistor 5004. The source of the first PMOS transistor 5003 is connected to the positive electrode VB1 of the power supply end of the adjust circuit. The connection end of the drain of the first PMOS transistor 5003 and the drain of the second NMOS transistor 5004 is the output end of the output module 30. The source of the second NMOS transistor 5004 is connected to the negative electrode VS1 of the power supply end of the adjust circuit.

The signal generator 5013 may include an oscillating circuit therein, to generate a continuous switch signal. For example, the switch signal is a pulse signal with a 50% duty cycle, and the pulse width may be selected with 100 ns.

The operating principle of the adjust circuit in this embodiment is as follows: during the normal operation of the IPM module 4100, the six input signals can be driven and amplified through the corresponding drive circuits, then output to the gates of the IGBT transistors of the corresponding bridge arms through the adjust circuits, so as to control the switching states of the IGBT transistors; and finally, corresponding three-phase drive signals are output for driving the motor. However, since the IPM module 4100 works in a non-ideal environment, the power supply is unstable, which may cause a fluctuation of the low-voltage power supply VDD of the IPM module 4100. In the case where the VDD is lower than the under voltage protection value of the IPM module 4100, the drive module cannot be normally operated and accordingly cuts off the drive signal, so that the output of the IPM module 4100 is suddenly disabled. Because the drive motor is an inductive load, the internal winding thereof will store energy to generate induced potential, and the induced potential will be transmitted to the IPM module 4100, causing charge accumulation of the IGBT transistors of the IPM module 4100. The adjust circuit connected to the IGBT transistor effects in releasing the charge accumulated in the IGBT transistor, the details of which are described as follows.

When the voltage detection module 10 detects that the voltage of the input end of the adjust circuit is less than the predetermined voltage threshold (such as, when the voltage of the non-inverting end of the comparator 5009 is lower than the voltage of the voltage source 5008 connected to the inverting end), the voltage detection module 10 outputs a first control signal, namely a low-level signal, to the control end of the second switch 5011 and the control end of the first switch 5001 through the output end of the comparator 5009, so as to turn the two switches from the on state in which the switches are normally operated to the off state.

In response to the first switch 5001 being turned off, the output end of the output module 30 is disconnected from the output end OUT of the adjust circuit, so as to cut off the drive signal output from the drive circuit to the corresponding IGBT transistor, that is, disable the output end OUT of the adjust circuit. At this time, the charge accumulated in the corresponding IGBT transistor is to be naturally released.

In response to the second switch 5011 being turned off, the first capacitor 5002 inside the time delay module 20 quickly discharges through the first resistor 5012, and outputs a low-level second control signal to the control end of the third switch 5007, so that the fixed end of the third switch 5007 is connected to the first selection end. At this time, the continuous switch signal generated by the signal generator 5013 is output to the second input end of the output module 30, that is, loaded on the gate of the second NMOS transistor 5004.

When the voltage detection module 10 detects that the voltage of the input end of the adjust circuit is greater than or equal to the predetermined voltage threshold (such as, when the voltage of the non-inverting end of the comparator 5009 is greater than or equal to the voltage of the voltage source 5008 connected to the inverting end), the voltage detection module 10 outputs a third control signal, namely a high-level signal, to the control end of the second switch 5011 and the control end of the first switch 5001 through the output end of the comparator 5009, so as to turn the two switches from the off state to the on state.

In response to the first switch 5001 being turned on, since the continuous switch signal generated by the signal generator 5013 is loaded on the gate of the second NMOS transistor 5004 to make the second NMOS transistor 5004 in the continuous switching state, the output module 30 outputs the low impedance state and the high impedance state in a continuously alternating manner. At this time, the charge accumulated in the corresponding IGBT transistor is continued to be released through the continuous switching state of the second NMOS transistor 5004, and during which the charge is released faster than when it is naturally released.

In response to the second switch 5011 being turned on, the voltage of the power supply VB1 of the adjust circuit charges the first capacitor 5002 through the second switch 5011 and the first resistor 5012. After the predetermined time elapses, the voltage of the first capacitor 5002 rises to a high level, and at this time the adjust circuit outputs a fourth control signal, so that the fixed end of the second switch 5007 is connected to the second selection end, and the adjust circuit controls the drive circuit to output the drive signal to the corresponding IGBT transistor through the output module 30, thereby resuming the normal transmission from the input end IN to the output end OUT of the adjust circuit, namely the IPM module 4100 is back to normal. Since the charge accumulated in the IGBT transistor is completely released after the predetermined time, the IPM module 4100 can be ensured to resume normal operation.

It should be noted that when detecting a low voltage due to the fluctuation of the low voltage power supply, namely the VDD, the adjust circuit first turns off the third switch 5007, in order to naturally release the charge accumulated in the corresponding IGBT transistor, rather than directly controls the second NMOS transistor 5004 to release the charge. Because more charge is now accumulated in the IGBT transistor, the releasing through the second NMOS transistor 5004 may produce a large releasing current, thereby causing excessive heat accumulation in the second NMOS transistor 5004 and possibly even damage to the second NMOS transistor 5004. Therefore, by turning off the third switch 5007 for naturally releasing the charge accumulated in the IGBT transistor, the releasing has been undergone for a while when the low voltage power supply is back to normal. The charge may be completely or incompletely released, which is determined according to the time from a moment when the voltage of the low voltage power supply drops till another moment when it resumes normal state. And by turning on the second NMOS transistor 5004 to further release the charge, the charge can be ensued to be completely released. Herein, the signal generator 5013 controls the continuous switching state of the second NMOS transistor 5004, it is because that the charge will not produce heat accumulation when being released through the second NMOS transistor 5004. For example, the second NMOS transistor 5004 is controlled to be on and off by using a pulse signal with a 50% duty cycle, that is, 50% of the time is for releasing heat and the other 50% is for cooling. If the second NMOS transistor 5004 is controlled to be in a continuous on-state, the releasing of the charge may cause excessive heat accumulation in the second NMOS transistor 5004 and possibly even damage to the second NMOS transistor 5004. In addition, the adjust circuit resumes normal operation after the predetermined time, which is advantageous for the operating reliability of the IPM module 4100.

The first resistor 5012 and the first capacitor 5002 corresponding to the time delay module 20 may be selected as follows.

The high level of the first capacitor 5002 after being charged is selected with 7.5V, and the time parameter Tx is selected with 1 μs, then:

$$Vth = V_{BS} \cdot \left(1 - e^{-\frac{Tx}{RC}}\right); \text{ obtaining } RC = \frac{10^{-6}}{0.693}$$

According to the above formula, the first capacitor 5002 may be selected with a capacitance of 10 pF, and the first resistor 5012 may be selected with a impedance of 144 kΩ to satisfy the requirements.

The above is related to the UH output adjust circuit 14A, and the other output adjust circuits have a similar operating principle. It should be noted that the power supplies of the UH output adjust circuit 14A, the VH output adjust circuit 24A, and the WH output adjust circuit 34A are the power supplies of the high voltage region of the corresponding phases. The power supply voltages are variable relative to the COM end of the low voltage region, but the voltages of the positive electrodes relative to the negative electrodes of the power supplies, namely the input voltages, remain unchanged during the normal operation of the IPM module 4100. The power supplies of the UL output adjust circuit 44A, the WL output adjust circuit 54A, and the VL output adjust circuit 64A are the power supply of the low voltage region of the IPM module 4100, and the voltage is nearly the same as the voltages of the positive electrodes relative to the negative electrodes of the power supplies of the high voltage region. When the low voltage power supply VDD of the IPM module 4100 fluctuates, since the charging for the three bootstrap capacitors will fluctuate with it, the voltages of the positive electrodes relative to the negative electrodes of the power supplies of the high voltage region will also fluctuate, so that the voltages is nearly the same as the voltage of the low voltage region.

In the IPM module 4100 according to this embodiment, an adjust circuit is additionally provided between each of the drive circuits and the corresponding IGBT transistor. The adjust circuit can detect a change in the voltage of the low voltage power supply of the IPM module 4100 in real time, and disable the output of the module when the voltage is detected to be too low due to the fluctuation of the low voltage power supply. In response to stored electronic energy of the drive motor causing charge accumulation of the IGBT transistor, the adjust circuit first cuts off the drive output and the drive signal of the IGBT transistor, in order to naturally release the charge accumulated in the IGBT transistor. When the low voltage power supply is restored to normal, the output module outputs the low impedance state, to continue releasing the charge accumulated in the IGBT transistor. After the predetermined time, the adjust circuit resumes the normal transmission from the input end to the output end, so that the drive signal output from the drive circuit can normally control the corresponding IGBT transistor. Because the charge accumulated in the IGBT transistor has been completely released, the normal operation of the module can be ensured, thereby preventing the operating reliability of the module from being affected by the impact of the accumulated charge.

Figure 6:
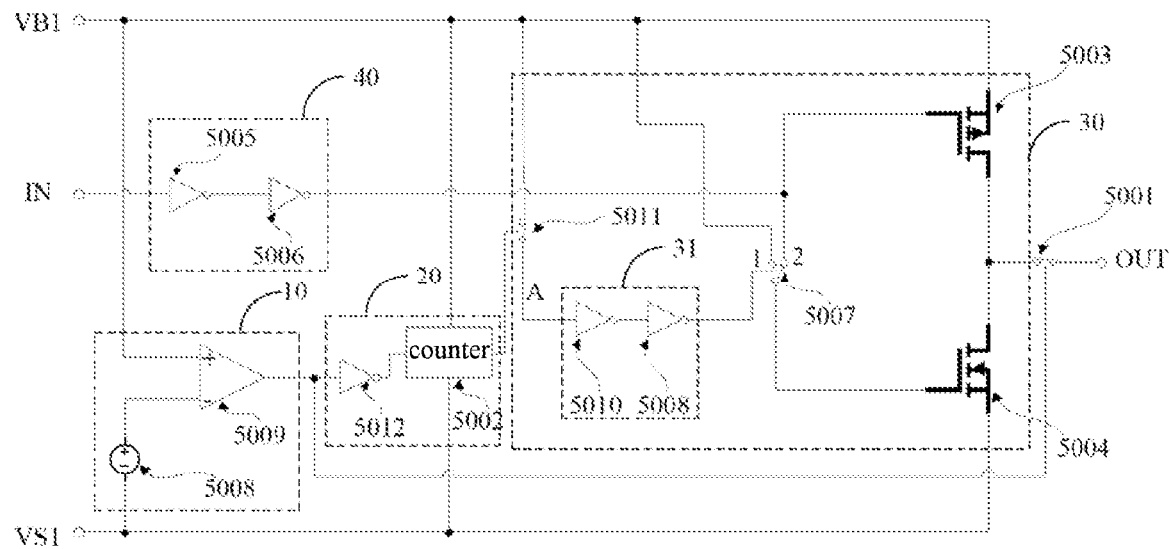
FIG. 6 is a detailed circuit structure diagram of an output adjust circuit in an intelligent power module according to another exemplary embodiment of the present disclosure.

Further, based on the first embodiment of the intelligent power module, in a fifth embodiment of the intelligent power module as shown in FIG. 6, the adjust circuit is further configured to:

detect the voltage of the power supply end thereof; in response to the determination to the voltage is less than the predetermined voltage threshold, cut off the drive signal output from the drive circuit to the corresponding IGBT transistor and start timing; in response to the determination that the timing does not reach the predetermined time and that the voltage is larger than or equal to the predetermined voltage threshold, release the charge in the corresponding IGBT transistor; and in response to the determination that the timing reaches the predetermined time, control the drive circuit to output the drive signal to the corresponding IGBT transistor.

In this embodiment, each adjust circuit includes a voltage detection module, a counting module, an output module, and a first switch. Taking the UH output adjust circuit 14A for example, as shown in FIG. 6, the UH output adjust circuit 14A includes a voltage detection module 10, a counting module 20, an output module 30, and a first switch 5001.

The input end IN of the adjust circuit is connected to the second selection end of a third switch 5007.

The input end of the voltage detection module 10, the power supply end of the counting module 20, and the power supply end of the output module 30 are connected to form the power supply end of the adjust circuit 14A. The output end of the voltage detection module 10 is respectively connected to the input end of the counting module 20 and the control end of the first switch 5001. The output end of the counting module 20 is connected to the control end of the output module 30. The input end of the output module 30 is the signal input end of the adjust circuit 14A, the output end of the output module 30 is connected to the input end of the first switch 5001. The output end of the first switch 5001 is the signal output end of the adjust circuit 14A.

The voltage detection module 10 is configured to, in response to detecting that the voltage of the input end of the adjust circuit 14A is less than the predetermined threshold, control the counting module 20 to start timing, and turn the first switch from the on state in which the first switch is normally operated to the off state.

The counting module 20 is configured to, at the beginning of the timing, output a first trigger signal to control the output module 30 to output the low impedance state.

When the timing does not reach the predetermined target time and the voltage is greater than or equal to the predetermined voltage threshold, the output module 30 outputs the low impedance state, in order to release the charge in the corresponding IGBT transistor. When the timing reaches the predetermined target time, the counting module 20 outputs a second trigger signal to control the drive circuit to output the drive signal to the corresponding IGBT transistor.

For example, the voltage detection module 10 includes a comparator 5009 and a voltage source 5008.

The non-inverting end of the comparator 5009 is connected to the positive electrode VB1 of the power supply end of the adjust circuit. The positive electrode of the voltage source 5008 is connected to the inverting end of the comparator 5009, and the negative electrode of the voltage source 5008 is connected to the negative electrode of the power supply end of the adjust circuit.

The counting module 10 includes a first NOT gate 5012 and a counter 5002.

The input end of the first NOT gate 5012 is the input end of the counting module 10, the output end of the first NOT gate 5012 is connected to the input end of the counter 5002, and the output end of the counter 5002 is the output end of the counting module 10.

The output module 30 includes a second switch 5011, the third switch 5007, a first PMOS transistor 5003, and a second NMOS transistor 5004.

The input end of the second switch 5011, the first selection end of the third switch 5007, and the source of the first PMOS transistor 5003 are respectively connected to the positive electrode VB1 of the power supply end of the adjust circuit 14A. The output end of the second switch 5011 is connected to the control end of the third switch 5007.

The second selection end of the third switch 5007 is connected to the gate of the first PMOS transistor 5003. The fixed end of the third switch 5007 is connected to the gate of the second NMOS transistor 5004. The connection end of the drain of the first PMOS transistor 5003 and the drain of the second NMOS transistor 5004 is the output end of the output module 30. The source of the second NMOS transistor 5004 is connected to the negative electrode VS1 of the power supply end of the adjust circuit 14A.

It will be appreciated that the first switch 5001, the second switch 5011, and the third switch 5007 may be analog electronic switches.

The operating principle of the adjust circuit in this embodiment is as follows: during the normal operation of the IPM module 4100, the six input signals can be driven and amplified through the corresponding drive circuits, then output to the gates of the IGBT transistors of the corresponding bridge arms through the adjust circuits, so as to control the switching states of the IGBT transistors; and finally, corresponding three-phase drive signals are output for driving the motor. However, since the IPM module 4100 works in a non-ideal environment, the power supply is unstable, which may cause a fluctuation of the low-voltage power supply VDD of the IPM module 4100. In the case where the VDD is lower than the under voltage protection value of the IPM module 4100, the drive module cannot be normally operated and accordingly cuts off the drive signal, so that the output of the IPM module 4100 is suddenly disabled. Because the drive motor is an inductive load, the internal winding thereof will store energy to generate induced potential, and the induced potential will be transmitted to the IPM module 4100, causing charge accumulation of the IGBT transistors of the IPM module 4100. The adjust circuit connected to the IGBT transistor effects in releasing the charge accumulated in the IGBT transistor, the details of which are described as follows.

When the voltage detection module 10 detects that the voltage of the input end of the adjust circuit is less than the predetermined voltage threshold (such as, when the voltage of the non-inverting end of the comparator 5009 is lower than the voltage of the voltage source 5008 connected to the inverting end), the voltage detection module 10 outputs a control signal, namely a low-level signal, to the control end of the first switch 5001 and the counting module 20 through the output end of the comparator 5009, so as to turn the first switch 5001 from the on state in which the first switch is normally operated to the off state.

In response to the first switch 5001 being turned off, the output end of the output module 30 is disconnected from the output end OUT of the adjust circuit, so as to cut off the drive signal output from the drive circuit to the corresponding IGBT transistor, that is, disable the output end OUT of the adjust circuit. At this time, the charge accumulated in the IGBT transistor is to be naturally released.

In response to the input end of the counting module being turned to the low level, it will be reversed to the high level after passing through the first NOT gate 5012 of the counting module 20. At this time, the low level at the input end of the counter 5002 is reversed to the high level, to enable the counter 5002 to start counting. In addition, the first trigger signal turning the output of the counter 5002 to the low level turns off the second switch 5011, so that the control end of the third switch 5007 is switched to the first selection end from the second selection end, and the positive electrode of the power supply of the adjust circuit is loaded on the gate of the second NMOS transistor 5004, so that the second NMOS transistor 5004 is turned on.

When the voltage detection module 10 detects that the voltage of the input end of the adjust circuit is raised to be greater than or equal to the predetermined voltage threshold (such as, when the voltage of the non-inverting end of the comparator 5009 is greater than or equal to the voltage of the voltage source 5008 connected to the inverting end), the voltage detection module 10 outputs a control signal, namely a high-level signal, to the control end of the first switch 5001 and the counting module 20 through the output end of the comparator 5009, so as to turn the first switch from the off state to the on state.

In response to the first switch 5001 being on, there exists two states according to the timing of the counting module 20, as follows.

If the timing of the counter 5002 in the counting module 20 does not reach the predetermined target time such as 1024 μs, the output end of the counter 5002 maintains the low level state, and the third switch 5007 maintains unchanged. Since the second NMOS transistor 5004 has been in the on state, the output module 30 outputs the low impedance state. At this time the charge accumulated in the IGBT transistor is continued to be released through the second NMOS transistor 5004, and during which the charge is released faster than when it is naturally released.

If the timing of the counter 5002 in the counting module 20 reaches the predetermined target time such as 1024 μs, the counter 5002 completes the timing and outputs the high-level second trigger signal, to turn on the second switch 5011, and to switch the control end of the third switch 5007 to the second selection end from the first selection end. In response to this, the drive signal is output to the corresponding IGBT transistor through the output module 30 and the first switch 5001, which realizes the normal transmission from the input end IN to the output end OUT of the adjust circuit, that is, the IPM module 4100 is resumes normal operation.

When the voltage of the input end of the adjust circuit resumes from its dropping, the time during which the charge accumulated in the IGBT transistor is further released through the output module 30 depends on a comparison between the time from a moment when the voltage drops to another moment when the voltage is restored to normal and the timing of the counting module 20. If the time from a moment when the voltage drops till another moment when the voltage is restored to normal is larger than the timing of the counting module 20, the charge accumulated in the IGBT transistor can be completely released in the natural manner. Thus, when the voltage is restored to normal, the output module can directly control the drive circuit to output the drive signal to the corresponding IGBT transistor through the first switch 5001, without the releasing through the output module outputting the low impedance state. If the time from a moment when the voltage drops to another moment when the voltage is restored to normal is less than the timing of the counting module 20, when the voltage is restored to normal, the charge accumulated in the IGBT transistor may be not completely released in the natural manner, and thus the further releasing through the output module outputting the low impedance state is needed. If the timing of the counting module 20 is 1024 μs, and the timing that the counting module 20 has timed when the voltage is restored to normal is TM, then the further releasing time TT is calculated as follows:

$$TT=1024-TM$$

The time TT ensures that the charge accumulated in the IGBT transistor is completely released after the above natural releasing.

In the IPM module 4100 according to this embodiment, an adjust circuit is additionally provided between each of the drive circuits and the corresponding IGBT transistor. The adjust circuit can detect a change in the voltage of the low voltage power supply of the IPM module 4100 in real time, and disable the output of the module when the voltage is detected to be too low due to the fluctuation of the low voltage power supply. In response to stored electronic energy of the drive motor causing charge accumulation of the IGBT transistor, the adjust circuit first cuts off the drive output and the drive signal of the IGBT transistor, in order to naturally release the charge accumulated in the IGBT transistor, and starts timing at the same time. When the low voltage power supply is restored to normal, if the time from a moment when the voltage drops till another moment when the voltage is restored to normal is larger than the target time, the adjust circuit directly controls the drive circuit to output the drive signal to the cone sponding IGBT transistor; and if the time from a moment when the voltage drops till another moment when the voltage is restored to normal is less than the target time, the output module outputs the low impedance state during the remaining time from a moment when the voltage is restored to normal till another moment when the timing reaches the target time, in order to continue releasing the charge accumulated in the IGBT transistor. This ensures a quick releasing of the charge accumulated in the IGBT transistor, and shortens the resuming time of the module, thereby allowing the module to resume normal operation faster, as well as preventing the operating reliability of the module from being affected by the impact of the accumulated charge.

Figure 7:
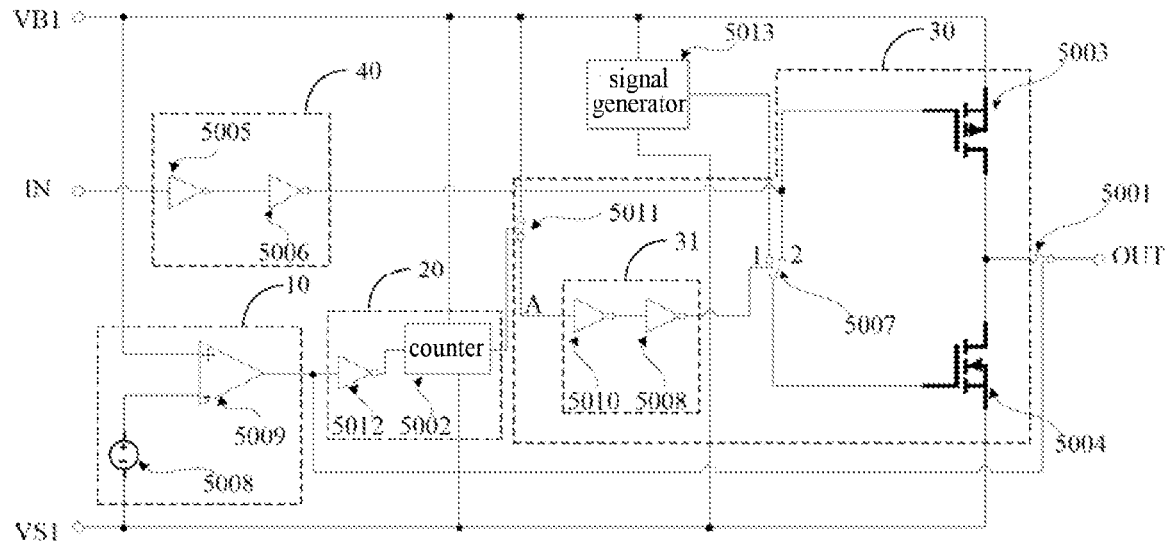
FIG. 7 is a detailed circuit structure diagram of an output adjust circuit in an intelligent power module according to another exemplary embodiment of the present disclosure.

Further, based on the first embodiment of the intelligent power module, in a sixth embodiment of the intelligent power module as shown in FIG. 7, the adjust circuit is further configured to:

detect the voltage of the power supply end thereof; in response to the determination that the voltage is less than the predetermined voltage threshold, cut off the drive signal output from the drive circuit to the corresponding IGBT transistor and start timing; in response to the determination that the timing does not reach the predetermined target time and that the voltage is larger than or equal to the predetermined voltage threshold, output the low impedance state and the high impedance state in a continuous alternating manner, to release the charge in the corresponding IGBT transistor, and in response to the determination that the timing reaches the predetermined target time, control the drive circuit to output the drive signal to the corresponding IGBT transistor.

In this embodiment, each adjust circuit includes a voltage detection module, a counting module, an output module, and a first switch. Taking the UH output adjust circuit 14A for example, as shown in FIG. 7, the UH output adjust circuit 14A includes a voltage detection module 10, a counting module 20, a signal generator 5013, an output module 30, and a first switch 5001.

The input end IN of the adjust circuit is connected to the second selection end of a third switch 5007.

The input end of the voltage detection module 10, the power supply end of the counting module 20, the input end of the first switch 5001, the power supply end of the signal generator 5013, and the power supply end of the output module 30 are connected to form the power supply end of the adjust circuit 14A. The output end of the voltage detection module 10 is respectively connected to the input end of the counting module 20 and the control end of the first switch 5001. The output end of the counting module 20 is connected to the first control end of the output module 30. The output end of the signal generator 5013 is connected to the second control end of the output module 30. The input end of the output module 30 is the signal input end of the adjust circuit 14A, the output end of the output module 30 is connected to the input end of the first switch 5001. The output end of the first switch 5001 is the signal output end of the adjust circuit 14A.

The voltage detection module 10 is configured to, in response to detecting that the voltage of the input end of the adjust circuit 14A is less than the predetermined threshold, control the counting module 20 to start timing, and turn the first switch from the on state in which the first switch is normally operated to the off state.

The counting module 20 is configured to, at the beginning of the timing, output a first trigger signal, and control the output module 30 to output a low impedance state and a high impedance state in a continuous alternating manner by using the first trigger signal combined with a pulse signal output by the signal generator 5013.

In response to the determination that the timing does not reach the predetermined target time, and the voltage is greater than or equal to the predetermined threshold, the output module 30 outputs the low impedance state and the high impedance state in a continuously alternating manner, in order to release the charge in the corresponding IGBT transistor. In response to the determination that the timing reaches the predetermined target time, the counting module 20 outputs a second trigger signal, to control the drive circuit to output the drive signal to the corresponding IGBT transistor.

For example, the voltage detection module 10 includes a comparator 5009 and a voltage source 5008.

The non-inverting end of the comparator 5009 is connected to the positive electrode VB1 of the power supply end of the adjust circuit. The positive electrode of the voltage source 5008 is connected to the inverting end of the comparator 5009, and the negative electrode of the voltage source 5008 is connected to the negative electrode of the power supply end of the adjust circuit.

The counting module 10 includes a first NOT gate 5012 and a counter 5002.

The input end of the first NOT gate 5012 is the input end of the counting module 10, the output end of the first NOT gate 5012 is connected to the input end of the counter 5002, and the output end of the counter 5002 is the output end of the counting module 10.

The output module 30 includes a second switch 5011, the third switch 5007, a first PMOS transistor 5003, and a second NMOS transistor 5004.

The input end of the second switch 5011, and the source of the first PMOS transistor 5003 are respectively connected to the positive electrode VB1 of the power supply end of the adjust circuit 14A. The output end of the second switch 5011 is connected to the control end of the third switch 5007. The control end of the second switch 5011 is the first control end of the output module 30.

The first selection end of the third switch 5007 is the second control end of the output module 30.

The second selection end of the third switch 5007 is connected to the gate of the first PMOS transistor 5003. The fixed end of the third switch 5007 is connected to the gate of the second NMOS transistor 5004. The connection end of the drain of the first PMOS transistor 5003 and the drain of the second NMOS transistor 5004 is the output end of the output module 30. The source of the second NMOS transistor 5004 is connected to the negative electrode VS1 of the power supply end of the adjust circuit 14A.

It will be appreciated that the first switch 5001, the second switch 5011, and the third switch 5007 may be analog electronic switches.

The operating principle of the adjust circuit in this embodiment is as follows: during the normal operation of the IPM module 4100, the six input signals can be driven and amplified through the corresponding drive circuits, then output to the gates of the IGBT transistors of the corresponding bridge arms through the adjust circuits, so as to control the switching states of the IGBT transistors; and finally, corresponding three-phase drive signals are output for driving the motor. However, since the IPM module 4100 works in a non-ideal environment, the power supply is unstable, which may cause a fluctuation of the low-voltage power supply VDD of the IPM module 4100. In the case where the VDD is lower than the under voltage protection value of the IPM module 4100, the drive module cannot be normally operated and accordingly cuts off the drive signal, so that the output of the IPM module 4100 is suddenly disabled. Because the drive motor is an inductive load, the internal winding thereof will store energy to generate induced potential, and the induced potential will be transmitted to the IPM module 4100, causing charge accumulation of the IGBT transistors of the IPM module 4100. The adjust circuit connected to the IGBT transistor effects in releasing the charge accumulated in the IGBT transistor, the details of which are described as follows.

When the voltage detection module 10 detects that the voltage of the input end of the adjust circuit is less than the predetermined voltage threshold (such as, when the voltage of the non-inverting end of the comparator 5009 is lower than the voltage of the voltage source 5008 connected to the inverting end), the voltage detection module 10 outputs a control signal, namely a low-level signal, to the control end of the first switch 5001 and the counting module 20 through the output end of the comparator 5009, so as to turn the first switch 5001 from the on state in which the first switch is normally operated to the off state.

In response to the determination that the first switch 5001 is being turned off, the output end of the output module 30 is disconnected from the output end OUT of the adjust circuit, so as to cut off the drive signal output from the drive circuit to the corresponding IGBT transistor, that is, disable the output end OUT of the adjust circuit. Accordingly, the charge accumulated in the IGBT transistor is to be naturally released.

In response to the input end of the counting module being turned to the low level, it will be reversed to the high level after passing through the first NOT gate 5012 of the counting module 20. At this time, the low level at the input end of the counter 5002 is reversed to the high level, to enable the counter 5002 to start counting. In addition, the first trigger signal turning the output of the counter 5002 to the low level turns off the second switch 5011, so that the control end of the third switch 5007 is switched to the first selection end from the second selection end, and the positive electrode of the power supply of the adjust circuit is loaded on the gate of the second NMOS transistor 5004, so that the second NMOS transistor 5004 is turned in the switching state. That is, the output module is made in the continuous alternating state of the low impedance and the high impedance.

When the voltage detection module 10 detects that the voltage of the input end of the adjust circuit is raised to be greater than or equal to the predetermined voltage threshold (such as, when the voltage of the non-inverting end of the comparator 5009 is greater than or equal to the voltage of the voltage source 5008 connected to the inverting end), the voltage detection module 10 outputs a control signal, namely a high-level signal, to the control end of the first switch 5001 and the counting module 20 through the output end of the comparator 5009, so as to turn the first switch 5001 from the off state to the on state.

In response to the first switch 5001 being on, there exists two states according to the timing of the counting module 20, as follows.

If the timing of the counter 5002 in the counting module 20 does not reach the predetermined target time such as 1024 μs, the output end of the counter 5002 maintains the low level sate, and the third switch 5007 maintains unchanged. Since the second NMOS transistor 5004 has been in the on state, the output module 30 outputs the low impedance state and the high impedance state in a continuously alternating manner. At this time, the charge accumulated in the IGBT transistor is continued to be released through the second NMOS transistor 5004, and during which the charge is released faster than when it is naturally released. Herein, the switching state of the second NMOS transistor 5004 is controlled by the signal generator 5013, this is because the releasing through the second NMOS transistor 5004 may not cause heat accumulation. For example, the second NMOS transistor 5004 is controlled by using a pulse with a 50% duty cycle, that is, 50% of the time is for releasing heat and the other 50% is used for cooling. If the second NMOS transistor 5004 is controlled to be in a continuous on state, the releasing may cause excessive heat accumulation in the second NMOS transistor 5004 and possibly even damage to the second NMOS transistor 5004. In addition, the adjust circuit resumes normal operation after the predetermined time, which is advantageous for the operating reliability of the IPM module 4100.

If the timing of the counter 5002 in the counting module 20 reaches the predetermined target time such as 1024 μs, the counter 5002 completes the timing and outputs the high-level second trigger signal, so as to turn on the second switch 5011, and to switch the control end of the third switch 5007 to the second selection end from the first selection end. At this time, the drive signal is output to the corresponding IGBT transistor through the output module 30 and the first switch 5001, which realizes the normal transmission from the input end IN to the output end OUT of the adjust circuit, that is, the IPM module 4100 is back to the normal operation.

When the voltage of the input end of the adjust circuit resumes from its dropping, the time during which the charge accumulated in the IGBT transistor is further released through the output module 30 depends on a comparison between the time from a moment when the voltage drops to another moment when the voltage is restored to normal and the timing of the counting module 20. If the time from a moment when the voltage drops till another moment when the voltage is restored to normal is larger than the timing of the counting module 20, the charge accumulated in the IGBT transistor can be completely released in the natural manner. Thus, when the voltage is restored to normal, the output module can directly control the drive circuit to output the drive signal to the corresponding IGBT transistor through the first switch 5001, without the further releasing through the output module outputting the low impedance state. If the time from a moment when the voltage drops till another moment when the voltage is restored to normal is less than the timing of the counting module 20, when the voltage is restored to normal, the charge accumulated in the IGBT transistor may be not completely released in the natural manner, and thus the further releasing through the output module outputting the low impedance state is needed. If the timing of the counting module 20 is 1024 μs, and the timing that the counting module 20 has counted when the voltage is restored to normal is TM, then the further releasing time TT is calculated as follows:

$$TT=1024-TM$$

The time TT ensures that the charge accumulated in the IGBT transistor is completely released after the above natural releasing.

In the IPM module 4100 according to this embodiment, an adjust circuit is additionally provided between each of the drive circuits and the corresponding IGBT transistor. The adjust circuit can detect a change in the voltage of the low voltage power supply of the IPM module 4100 in real time, and disable the output of the module when the voltage is detected to be too low due to the fluctuation of the low voltage power supply. In response to the stored electronic energy of the drive motor causing charge accumulation of the IGBT transistor, the adjust circuit first cuts off the drive output and the drive signal of the IGBT transistor, in order to naturally release the charge accumulated in the IGBT transistor, and starts timing at the same time. When the low voltage power supply is restored to normal, if the time from a moment when the voltage drops till another moment when the voltage is restored to normal is larger than the target time, the adjust circuit directly controls the drive circuit to output the drive signal to the corresponding IGBT transistor; and if the time from a moment when the voltage drops till another moment when the voltage is restored to normal is less than the target time, the output module outputs the low impedance state and the high impedance state in a continuous alternating manner during the remaining time from a moment when the voltage is restored to normal till another moment when the timing reaches the target time, so as to further releasing the charge accumulated in the IGBT transistor. This ensures a quick releasing of the charge accumulated in the IGBT transistor, and shortens the resuming time of the IPM module 4100, thereby allowing the module to resume normal operation faster, as well as preventing the operating reliability of the module from being affected by the impact of the accumulated charge.

Figure 8:
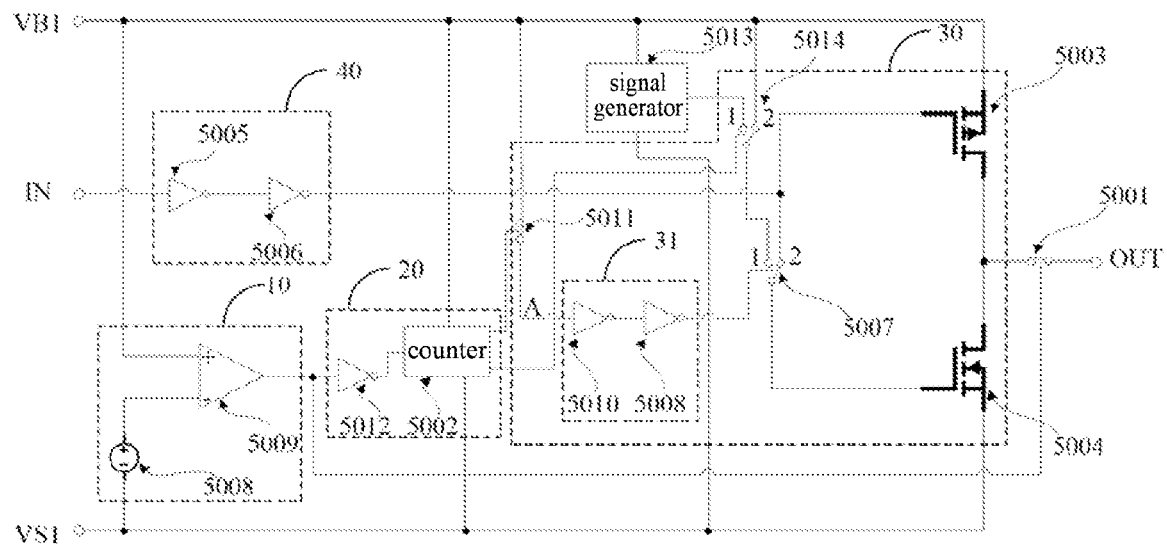
FIG. 8 is a detailed circuit structure diagram of an output adjust circuit in an intelligent power module according to another exemplary embodiment of the present disclosure.

Further, based on the first embodiment of the intelligent power module, in a seventh embodiment of the intelligent power module as shown in FIG. 8, the adjust circuit is further configured to:

detect the voltage of the power supply end thereof; in response to the determination that the voltage is less than the predetermined voltage threshold, cut off the drive signal output from the drive circuit to the corresponding IGBT transistor and start timing; and in response to the determination that the voltage is larger than or equal to the predetermined voltage threshold, if the timing does not reach the first target time, output the low impedance state and the high impedance state in a continuous alternating manner, to release the charge in the corresponding IGBT transistor; if the timing exceeds the first target time but does not reach the second target time, output the low impedance state, to release the charge in the corresponding IGBT transistor; and if the timing exceeds the second target time, control the drive circuit to output the drive signal to the corresponding IGBT transistor.

In this embodiment, each adjust circuit includes a voltage detection module, a counting module, an output module, and a first switch. Taking the UH output adjust circuit 14A for example, as shown in FIG. 8, the UH output adjust circuit 14A includes a voltage detection module 10, a counting module 20, a signal generator 5013, an output module 30, and a first switch 5001.

The input end IN of the adjust circuit is connected to the second selection end of a fourth switch 5007.

The input end of the voltage detection module 10, the power supply end of the counting module 20, the input end of the first switch 5001, the power supply end of the signal generator 5013, and the power supply end of the output module 30 are connected to form the power supply end of the adjust circuit 14A. The output end of the voltage detection module 10 is respectively connected to the input end of the counting module 20 and the control end of the first switch 5001. The first output end of the counting module 20 is connected to the first control end of the output module 30. The second output end of the counting module 20 is connected to the second control end of the output module 30. The output end of the signal generator 5013 is connected to the third control end of the output module 30. The input end of the output module 30 is the signal input end of the adjust circuit 14A, the output end of the output module 30 is connected to the input end of the first switch 5001. The output end of the first switch 5001 is the signal output end of the adjust circuit 14A.

The voltage detection module 10 is configured to, in response to detecting that the voltage of the input end of the adjust circuit 14A is less than the predetermined threshold, control the counting module 20 to start timing, and turn the first switch from on-state in which the first switch is normally operated to off-state.

The counting module 20 is configured to, at the beginning of the timing, output a first trigger signal simultaneously through the first output end and the second output end thereof, to control, combined with a pulse signal output by the first signal generator, the output module 30 to output a low impedance state and a high impedance state in a continuous alternating manner. In addition, in response to the timing exceeds a first target time but not reach a second target time, the counting module 20 is configured to output a second trigger signal through the second output end thereof, to control the output module 30 to output the low impedance state.

When the voltage is larger than or equal to the predetermined voltage threshold, if the timing does not reach the first target time, the output module 30 outputs the low impedance state and the high impedance state in a continuously alternating manner, in order to release the charge stored in the corresponding IGBT transistor; if the timing exceeds the first target time but does not reach the second target time, the output module 30 outputs the low impedance state, in order to continue releasing the charge in the corresponding IGBT transistor; and if the timing reaches the second target time, the counting module 20 outputs a third trigger signal, to control the drive circuit to output the drive signal to the corresponding IGBT transistor.

For example, the voltage detection module 10 includes a comparator 5009 and a voltage source 5008.

The non-inverting end of the comparator 5009 is connected to the positive electrode VB1 of the power supply end of the adjust circuit. The positive electrode of the voltage source 5008 is connected to the inverting end of the comparator 5009, and the negative electrode of the voltage source 5008 is connected to the negative electrode of the power supply end of the adjust circuit.

The counting module 10 includes a first NOT gate 5012 and a counter 5002.

The input end of the first NOT gate 5012 is the input end of the counting module 10, and the output end of the first NOT gate 5012 is connected to the input end of the counter 5002.

The first output end of the counter 5002 is the first output end of the counting module 10, and the second output end of the counter 5002 is the second output end of the counting module 10.

The output module 30 includes a second switch 5011, a third switch 5014, the fourth switch 5007, a first PMOS transistor 5003, and a second NMOS transistor 5004.

The input end of the second switch 5011, the second selection end of the third switch 5014, and the source of the first PMOS transistor 5003 are respectively connected to the positive electrode of the power supply end of the adjust circuit 14A. The output end of the second switch 5011 is connected to the control end of the fourth switch. The control end of the second switch 5011 is the first control end of the output module 30.

The control end of the fourth switch 5007 is the second end of the output module 30, the first selection end of the fourth switch 5007 is the third selection end of the output module 30, and the fixed end of the fourth switch 5007 is connected to the first selection end of the fourth switch.

The second selection end of the fourth switch 5007 is connected to the gate of the first PMOS transistor 5003. The fixed end of the fourth switch 5007 is connected to the gate of the second NMOS transistor 5004. The connection end of the drain of the first PMOS transistor 5003 and the drain of the second NMOS transistor 5004 is the output end of the output module 30. The source of the second NMOS transistor 5004 is connected to the negative electrode VS1 of the power supply end of the adjust circuit 14A.

It will be appreciated that the first switch 5001, the second switch 5011, the third switch 5014, and the fourth switch 5007 may be analog electronic switches.

The operating principle of the adjust circuit in this embodiment is as follows: during the normal operation of the IPM module 4100, the six input signals can be driven and amplified through the corresponding drive circuits, then output to the gates of the IGBT transistors of the corresponding bridge arms through the adjust circuits, so as to control the switching states of the IGBT transistors; and finally, corresponding three-phase drive signals are output for driving the motor. However, since the IPM module 4100 works in a non-ideal environment, the power supply is unstable, which may cause a fluctuation of the low-voltage power supply VDD of the IPM module 4100. In the case where the VDD is lower than the under voltage protection value of the IPM module 4100, the drive module cannot be normally operated and accordingly cuts off the drive signal, so that the output of the IPM module 4100 is suddenly disabled. Because the drive motor is an inductive load, the internal winding thereof will store energy to generate induced potential, and the induced potential will be transmitted to the IPM module 4100, causing charge accumulation of the IGBT transistors of the IPM module 4100. The adjust circuit connected to the IGBT transistor effects in releasing the charge accumulated in the IGBT transistor, the details of which are described as follows.

When the voltage detection module 10 detects that the voltage of the input end of the adjust circuit is less than the predetermined voltage threshold (such as, when the voltage of the non-inverting end of the comparator 5009 is lower than the voltage of the voltage source 5008 connected to the inverting end), the voltage detection module 10 outputs a control signal, namely a low-level signal, to the control end of the first switch 5001 and the counting module 20 through the output end of the comparator 5009, so as to turn the first switch 5001 from the on state in which the first switch is normally operated to the off state.

In response to the first switch 5001 being turned off, the output end of the output module 30 is disconnected from the output end OUT of the adjust circuit, so as to cut off the drive signal output from the drive circuit to the corresponding IGBT transistor, that is, disable the output end OUT of the adjust circuit. And accordingly, the charge accumulated in the IGBT transistor is to be naturally released.

In response to the input end of the counting module being turned to the low level, it will be reversed to the high level after passing through the first NOT gate 5012 of the counting module 20. At this time, the low level at the input end of the counter 5002 is reversed to the high level, to enable the counter 5002 to start counting. In addition, the first trigger signal simultaneously turning the first output end and the second output end of the counter 5002 to the low level turns off the second switch 5011, so that the fixed end of the third switch 5014 is connected to the first selection end.

When the fixed end of the third switch 5014 is connected to the first selection end, the signal generator 5013 outputs a pulse signal to the selection end of the fourth switch 5007. In response to the second switch 5011 being turned off, the control end of the fourth switch 5007 is switched to the first selection end from the second selection end. At this time, the pulse signal is loaded on the gate of the second NMOS transistor 5004 in the output module 30, to make the second NMOS transistor 5004 in the switching state, namely, control the output module in the continuous alternating manner of the low impedance and the high impedance.

When the voltage detection module 10 detects that the voltage of the input end of the adjust circuit rises to be greater than or equal to the predetermined voltage threshold (such as, when the voltage of the non-inverting end of the comparator 5009 is greater than or equal to the voltage of the voltage source 5008 connected to the inverting end), the voltage detection module 10 outputs a control signal, namely a high-level signal, to the control end of the first switch 5001 and the counting module 20 through the output end of the comparator 5009, so as to turn the first switch 5001 from the off state to the on state.

In response to the first switch 5001 being on, there exists three states according to the timing of the counting module 20, as follows.

If the timing of the counter 5002 in the counting module 20 does not reach the first predetermined target time such as 1024 μs, the first output end and the second output end of the counter 5002 output the low-level first trigger signal, the signal generator 5013 outputs a pulse signal through the third switch 5014 and the fourth switch 5007, so that the second NMOS transistor 5004 is turned in the switching state, and accordingly the outputs module outputs the low impedance state and the high impedance state in a continuously alternating manner. In response to this, the charge accumulated in the IGBT transistor can be further released through the second NMOS transistor 5004, and during which the charge is released faster than when it is naturally released. Herein, the switching state of the second NMOS transistor 5004 is controlled by the signal generator 5013, this is because the releasing through the second NMOS transistor 5004 will not cause heat accumulation. For example, the second NMOS transistor 5004 is controlled by using a pulse with a 50% duty cycle, that is, 50% of the time is used to release heat and the other 50% is used for cooling. If the second NMOS transistor 5004 is controlled to be in continuous on state, the releasing may cause excessive heat accumulation in the second NMOS transistor 5004 and possibly even damage to the second NMOS transistor 5004. In addition, the adjust circuit is back to normal after the predetermined duration, which is advantageous for the operating reliability of the IPM module 4100.

If the timing of the counter 5002 in the counting module 20 reaches or exceeds the first predetermined target time 1024 µs but does not reach the second predetermined target time 2048 µs, the second output end of the counter 5002 outputs the high-level second trigger signal, so as to connect the fixed end of the third switch 5014 to the second selection end. At this time, the positive electrode of the power supply end of the adjust circuit 14A is loaded on the gate of the second NMOS transistor 5004 through the third switch 5014 and the fourth switch 5007, to make the second NMOS transistor 5004 in the continuous on state. That is, the output module outputs the low impedance state in a continuously manner, and accordingly the charge accumulated in the IGBT transistor can be continued to be released through the second NMOS transistor 5004. Since the second NMOS transistor 5004 is in the continuous on state, the charge is released faster than it is released when the second NMOS transistor 5004 is in the switching state, which ensures a quick and complete releasing. In addition, most of the charge has been released in the switching state, thus when the second NMOS transistor 5004 is in the continuous on state, the releasing of the charge accumulated in the IGBT transistor will not produce a large releasing current, which improves the releasing speed while ensuring the operating safety.

If the timing of the counter 5002 in the counting module 20 reaches the second target time such as 2048 µs, the counter 5002 completes the timing and outputs the high-level third trigger signal through the first output end thereof, so as to turn on the second switch 5011, and to connect the control end of the fourth switch 5007 to the second selection end from the first selection end. In response to this, the drive signal output by the drive circuit can be transmitted to the corresponding IGBT transistor through the output module 30 and the first switch 5001, which realizes the normal transmission from the input end IN to the output end OUT of the adjust circuit, that is, the IPM module 4100 is back to the normal operation.

When the voltage of the input end of the adjust circuit resumes from its dropping, the time during which the charge accumulated in the IGBT transistor is further released through the output module 30 depends on a comparison between the time from a moment when the voltage drops to another moment when the voltage is restored to normal and the timing of the counting module 20. If the time from a moment when the voltage drops to another moment when the voltage is restored to normal is larger than the second target time of the counting module 20, the charge accumulated in the IGBT transistor can be completely released in the natural manner. Thus, when the voltage is restored to normal, the output module can directly control the drive circuit to output the drive signal to the corresponding IGBT transistor through the first switch 5001, without the releasing through the output module outputting the low impedance state. If the time from a moment when the voltage drops to another moment when the voltage is restored to normal is less than the second target time of the counting module 20, when the voltage is restored to normal, the charge accumulated in the IGBT transistor may be not completely released in the natural manner, and thus the further releasing through the output module outputting the low impedance state is needed. In this duration, if the timing is less than the first target time 1024 µs smaller than the second target time 2048 µs, the releasing is conducted through the output module 30 outputting the low impedance state and the high impedance state in the continuously alternating manner, or if the timing is larger than the first target time, the releasing is conducted through the output module 30 outputting the lower impedance state. If the timing of the counting module 20 is 2048 µs, and the timing that the counting module 20 has timed when the voltage is restored to normal is TM, then the further releasing time TT is calculated as follows:

$$TT=2048-TM$$

The time TT ensures that the charge accumulated in the IGBT transistor is completely released after the above natural releasing.

In the IPM module 4100 according to this embodiment, an adjust circuit is additionally provided between each of the drive circuits and the corresponding IGBT transistor. The adjust circuit can detect a change in the voltage of the low voltage power supply of the IPM module 4100 in real time, and disable the output of the module when the voltage is detected to be too low due to the fluctuation of the low voltage power supply. In response to the stored electronic energy of the drive motor causing charge accumulation of the IGBT transistor, the adjust circuit first cuts off the drive output and the drive signal of the IGBT transistor, in order to naturally release the charge accumulated in the IGBT transistor, and starts timing at the same time. When the low voltage power supply is restored to normal, if the time from a moment when the voltage drops till another moment when the voltage is restored to normal exceeds the second target time, the adjust circuit directly controls the drive circuit to output the drive signal to the corresponding IGBT transistor; if the time from a moment when the voltage drops till another moment when the voltage is restored to normal is less than the second target time but larger than the first target time, the output module outputs the low impedance state during the remaining time from a moment when the voltage is restored to normal till another moment when the timing reaches the target time, in order to continue releasing the charge accumulated in the IGBT transistor; and if the time from a moment when the voltage drops till another moment when the voltage is restored to normal is less than the first target time, the output module outputs the low impedance state and the high impedance state in a continuous alternating manner during the first target time, ensuring a more safe releasing, and outputs the low impedance state in a duration, to allow the releasing faster. This ensures a faster releasing, and shortens the resuming time of the IPM module 4100, thereby allowing the module to quickly resume normal operation, as well as preventing operating reliability of the module from being affected by the impact of the accumulated charge.

Figure 9:
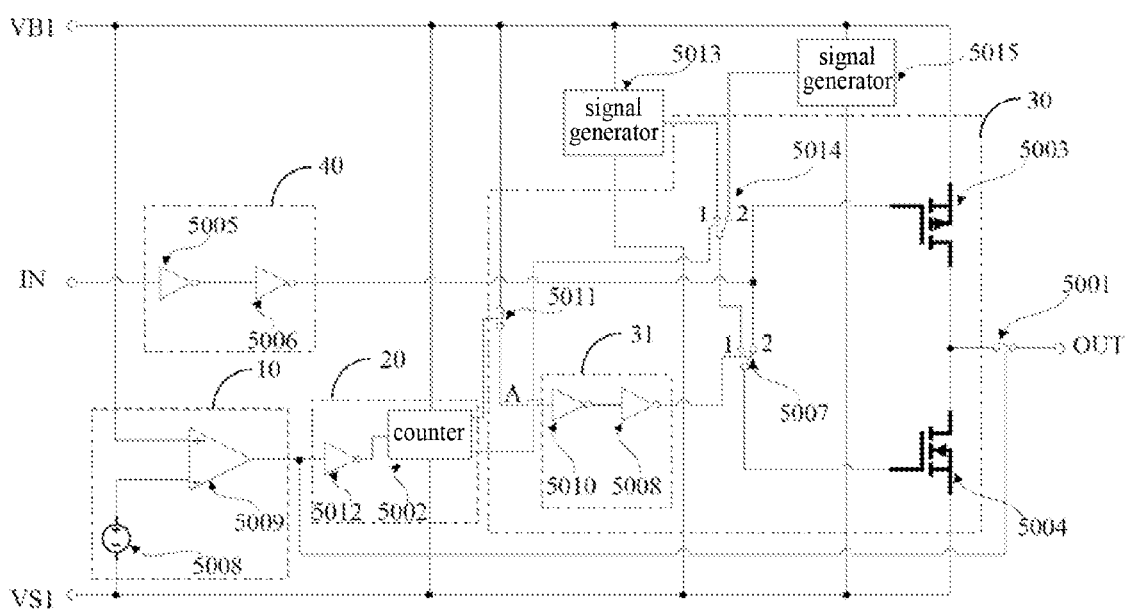
FIG. 9 is a detailed circuit structure diagram of an output adjust circuit in an intelligent power module according to another exemplary embodiment of the present disclosure.

Further, based on the first embodiment of the intelligent power module, in an eighth embodiment of the intelligent power module as shown in FIG. 9, the adjust circuit is further configured to:

detect the voltage of the power supply end thereof; in response to the determination that the voltage is less than the predetermined voltage threshold, cut off the drive signal output from the drive circuit to the corresponding IGBT transistor and start timing; and in response to the determination that the voltage is larger than or equal to the predetermined voltage threshold, if the timing does not reach the first target time, output the low impedance state and the high impedance state in a continuous alternating manner with the low impedance state as the first duty cycle, to release the charge in the corresponding IGBT transistor; if the timing exceeds the first target time but does not reach the second target time, output the low impedance state and the high impedance state in a continuous alternating manner with the low impedance state as the second duty cycle, to release the charge in the corresponding IGBT transistor, wherein the first duty cycle is smaller than the second duty cycle; and if the timing exceeds the second target time, control the drive circuit to output the drive signal to the corresponding IGBT transistor.

In this embodiment, each adjust circuit includes a voltage detection module, a counting module, an output module, and a first switch. Taking the UH output adjust circuit 14A for example, as shown in FIG. 9, the UH output adjust circuit 14A includes a voltage detection module 10, a counting module 20, a first signal generator 5013, a second signal generator 5015, an output module 30, and a first switch 5001.

The input end IN of the adjust circuit is connected to the second selection end of a fourth switch 5007.

The input end of the voltage detection module 10, the power supply end of the counting module 20, the input end of the first switch 5001, the power supply end of the first signal generator 5013, the power supply end of the second signal generator 5015, and the power supply end of the output module 30 are connected to form the power supply end of the adjust circuit 14A. The output end of the voltage detection module 10 is respectively connected to the input end of the counting module 20 and the control end of the first switch 5001. The first output end of the counting module 20 is connected to the first control end of the output module 30. The second output end of the counting module 20 is connected to the second control end of the output module 30. The output end of the first signal generator 5013 is connected to the third control end of the output module 30. The output end of the second signal generator 5015 is connected to the fourth control end of the output module 30. The input end of the output module 30 is the signal input end of the adjust circuit 14A. The output end of the output module 30 is connected to the input end of the first switch 5001. The output end of the first switch 5001 is the signal output end of the adjust circuit 14A.

The voltage detection module 10 is configured to, in response to detecting that the voltage of the input end of the adjust circuit 14A is less than the predetermined threshold, control the counting module 20 to start timing, and turn the first switch from the on state in which the first switch is normally operated to the off state.

The counting module 20 is configured to, at the beginning of the timing, output a first trigger signal simultaneously through the first output end and the second output end thereof, to control, combined with a pulse signal output by the first signal generator, the output module 30 to output a low impedance state and a high impedance state in a continuous alternating manner with the low impedance state as a first duty cycle. In addition, in response to the timing exceeds a first target time but does not reach a second target time, the counting module 20 is configured to output a second trigger signal through the second output end thereof, and control, combined with a pulse signal output by the second signal generator, the output module 30 to output the low impedance state with the low impedance state as a second duty cycle.

When the voltage is larger than or equal to the predetermined voltage threshold, if the timing does not reach the first predetermined target time, the output module 30 outputs the low impedance state and the high impedance state in a continuously alternating manner with the low impedance state as the first duty cycle, in order to release the charge in the corresponding IGBT transistor; if the timing exceeds the first predetermined target time but does not reach the second predetermined target time, the output module 30 outputs the low impedance state and the high impedance state in the continuously alternating manner with the low impedance state as the second duty cycle, in order to continue releasing the charge in the corresponding IGBT transistor; and if the timing reaches the second predetermined target time, the counting module 20 outputs a third trigger signal, to control the drive circuit to output the drive signal to the corresponding IGBT transistor.

For example, the voltage detection module 10 includes a comparator 5009 and a voltage source 5008.

The non-inverting end of the comparator 5009 is connected to the positive electrode VB1 of the power supply end of the adjust circuit. The positive electrode of the voltage source 5008 is connected to the inverting end of the comparator 5009, and the negative electrode of the voltage source 5008 is connected to the negative electrode of the power supply end of the adjust circuit.

The counting module 10 includes a first NOT gate 5012 and a counter 5002.

The input end of the first NOT gate 5012 is the input end of the counting module 10, and the output end of the first NOT gate 5012 is connected to the input end of the counter 5002.

The first output end of the counter 5002 is the first output end of the counting module 10, and the second output end of the counter 5002 is the second output end of the counting module 10.

The output module 30 includes a second switch 5011, a third switch 5014, the fourth switch 5007, a first PMOS transistor 5003, and a second NMOS transistor 5004.

The input end of the second switch 5011 and the source of the first PMOS transistor 5003 are respectively connected to the positive electrode of the power supply end of the adjust circuit. The output end of the second switch 5011 is connected to the control end of the fourth switch. The control end of the second switch 5011 is the first control end of the output module 30.

The control end of the third switch 5014 is the second control end of the output module 30, the first selection end of the third switch 5014 is the third control end of the output module 30, the second selection end of the third switch 5014 is the fourth control end of the output module 30, and the fixed end of the third switch 5014 is the first selection end of the fourth switch 5007.

The second selection end of the fourth switch 5007 is connected to the gate of the first PMOS transistor 5003. The fixed end of the fourth switch 5007 is connected to the gate of the second NMOS transistor 5004. The connection end of the drain of the first PMOS transistor 5003 and the drain of the second NMOS transistor 5004 is the output end of the output module 30. The source of the second NMOS transistor 5004 is connected to the negative electrode VS1 of the power supply end of the adjust circuit 14A.

It will be appreciated that the first switch 5001, the second switch 5011, the third switch 5014, and the fourth switch 5007 may be analog electronic switches.

The operating principle of the adjust circuit in this embodiment is as follows: during the normal operation of the IPM module 4100, the six input signals can be driven and amplified through the corresponding drive circuits, then output to the gates of the IGBT transistors of the corresponding bridge arms through the adjust circuits, so as to control the switching states of the IGBT transistors; and finally, corresponding three-phase drive signals are output for driving the motor. However, since the IPM module 4100 works in a non-ideal environment, the power supply is unstable, which may cause a fluctuation of the low-voltage power supply VDD of the IPM module 4100. In the case where the VDD is lower than the under voltage protection value of the IPM module 4100, the drive module cannot be normally operated and accordingly cuts off the drive signal, so that the output of the IPM module 4100 is suddenly disabled. Because the drive motor is an inductive load, the internal winding thereof will store energy to generate induced potential, and the induced potential will be transmitted to the IPM module 4100, causing charge accumulation of the IGBT transistors of the IPM module 4100. The adjust circuit connected to the IGBT transistor effects in releasing the charge accumulated in the IGBT transistor, the details of which are described as follows.

When the voltage detection module 10 detects that the voltage of the input end of the adjust circuit is less than the predetermined voltage threshold (such as, when the voltage of the non-inverting end of the comparator 5009 is lower than the voltage of the voltage source 5008 connected to the inverting end), the voltage detection module 10 outputs a control signal, namely a low-level signal, to the control end of the first switch 5001 and the counting module 20 through the output end of the comparator 5009, so as to turn the first switch 5001 from the on state in which the first switch is normally operated to the off state.

In response to the first switch 5001 being turned off, the output end of the output module 30 is disconnected from the output end OUT of the adjust circuit, so as to cut off the drive signal output from the drive circuit to the corresponding IGBT transistor, that is, disable the output end OUT of the adjust circuit. And accordingly, the charge accumulated in the IGBT transistor is to be naturally released.

In response to the input end of the counting module being turned to the low level, it will be reversed to the high level after passing through the first NOT gate 5012 of the counting module 20. At this time, the low level at the input end of the counter 5002 is reversed to the high level, to enable the counter 5002 to start counting. In addition, the first trigger signal simultaneously turning the first output end and the second output end of the counter 5002 from the high level to the low level turns off the second switch 5011, so that the fixed end of the third switch 5014 is connected to the first selection end.

When the fixed end of the third switch 5014 is connected to the first selection end, the signal generator 5013 outputs a pulse signal to the selection end of the fourth switch 5007. In response to the second switch 5011 being turned off, the control end of the fourth switch 5007 is switched to the first selection end from the second selection end, and the pulse signal generated by the first signal generator 5013 is loaded on the gate of the second NMOS transistor 5004 in the output module 30, which makes the second NMOS transistor 5004 in the switching state. The pulse signal has the first duty cycle, that is, the output module is controlled to output the low impedance state and the high impedance state in the continuously alternating manner with the low impedance state as the first duty cycle. For example, if the width of the pulse signal is 100 ns, the first duty cycle is 30%, then the time length of the low impedance state of an effective level is 30 ns.

When the voltage detection module 10 detects that the voltage of the input end of the adjust circuit rises to be greater than or equal to the predetermined voltage threshold (such as, when the voltage of the non-inverting end of the comparator 5009 is greater than or equal to the voltage of the voltage source 5008 connected to the inverting end), the voltage detection module 10 outputs a control signal, namely a high-level signal, to the control end of the first switch 5001 and the counting module 20 through the output end of the comparator 5009, so as to control the first switch 5001 from the off state to the on state.

In response to the first switch 5001 being on, there exists three states according to the timing of the counting module 20, as follows.

If the timing of the counter 5002 in the counting module 20 does not reach the first predetermined target time such as 1024 µs, the first output end and the second output end of the counter 5002 output the low-level first trigger signal, the signal generator 5013 outputs a pulse signal through the third switch 5014 and the fourth switch 5007, so that the second NMOS transistor 5004 is turned in the switching state, and accordingly the outputs module outputs the low impedance state and the high impedance state in a continuously alternating manner. At this time, the charge accumulated in the IGBT transistor can be further released through the second NMOS transistor 5004, and during which the charge is released faster than when it is naturally released. Herein, the switching state of the second NMOS transistor 5004 is controlled by the signal generator 5013, this is because the releasing through the second NMOS transistor 5004 may not cause heat accumulation. For example, the second NMOS transistor 5004 is controlled by using a pulse with a 30% duty cycle, that is, 30% of the time is for releasing heat and the other 70% is used for cooling. If the second NMOS transistor 5004 is controlled to be in the continuous on state, the releasing may cause excessive heat accumulation in the second NMOS transistor 5004 and possibly even damage to the second NMOS transistor 5004. In addition, the adjust circuit resumes normal operation after the predetermined time, which is advantageous for the operating reliability of the IPM module 4100.

If the timing of the counter 5002 in the counting module 20 reaches or exceeds the first predetermined target time 1024 µs but does not reach the second predetermined target time 2048 µs, the second output end of the counter 5002 outputs the high-level second trigger signal, in order to connect the fixed end of the third switch 5014 to the second selection end. At this time, the pulse signal generated by the second signal generator 5015 is loaded on the gate of the second NMOS transistor 5004 through the third switch 5014 and the fourth switch 5007. The pulse signal has the second duty cycle that is larger than the first duty cycle of the pulse signal generated by the first signal generator 5013, for example, the width of the pulse signal is 100 ns, and the second duty cycle is 70%, so that the second NMOS transistor 5004 is turned in the switching state. At this time, the output module outputs the low impedance state and the high impedance state in a continuously manner with the low impedance state as the second duty cycle, and the charge accumulated in the IGBT transistor can be continued to be released through the second NMOS transistor 5004. Because the time length of the low impedance state of the second duty cycle is larger than that of the first duty cycle, the releasing is faster in duration with the second duty cycle than that in duration with the first duty cycle, thereby ensuring a quick and complete releasing. Since most of the charge has been released in duration with the first duty cycle, when the second NMOS transistor 5004 is in the continuous on state, the releasing of the charge accumulated in the IGBT transistor may not produce a large releasing current, thereby improving the releasing speed while ensuring the operating safety.

If the timing of the counter 5002 in the counting module 20 reaches the second target time such as 2048 µs, the counter 5002 completes the timing and outputs the high-level third trigger signal through the first output end thereof, so as to turn on the second switch 5011, and to switch the control end of the fourth switch 5007 to the second selection end from the first selection end. In response to this, the drive signal output from the drive circuit can be transmitted to the corresponding IGBT transistor through the output module 30 and the first switch 5001, which realizes the normal transmission from the input end IN to the output end OUT of the adjust circuit, that is, the IPM module 4100 is back to the normal operation.

When the voltage of the input end of the adjust circuit resumes from its dropping, the time during which the charge accumulated in the IGBT transistor is further released through the output module 30 depends on a comparison between the time from a moment when the voltage drops to another moment when the voltage is restored to normal and the timing of the counting module 20. If the time from a moment when the voltage drops to another moment when the voltage is restored to normal is larger than the second target time of the counting module 20, the charge accumulated in the IGBT transistor can be completely released in the natural manner. Thus, when the voltage is restored to normal, the output module can directly control the drive circuit to output the drive signal to the corresponding IGBT transistor through the first switch 5001, without the releasing through the output module outputting the low impedance state. If the time from a moment when the voltage drops to another moment when the voltage is restored to normal is less than the second target time of the counting module 20, when the voltage is restored to normal, the charge accumulated in the IGBT transistor may be not completely released in the natural manner, and thus the further releasing through the output module outputting the low impedance state is needed. In this duration, if the timing is less than the first target time 1024 µs, the releasing is conducted through the output module 30 outputting the low impedance state and the high impedance state in the continuously alternating manner with the low impedance as the first duty cycle, or if the timing is larger than the first target time, the releasing is conducted through the output module 30 outputting the low impedance state and the high impedance state in the continuously alternating manner with the larger low impedance as the second duty cycle. If the timing of the counting module 20 is 2048 µs, and the timing that the counting module 20 has timed when the voltage is restored to normal is TM, then the further releasing time TT is calculated as follows:

$$TT = 2048 - TM$$

The time TT ensures that the charge accumulated in the IGBT transistor is completely released after the above natural releasing.

In the IPM module 4100 according to this embodiment, an adjust circuit is additionally provided between each of the drive circuits and the corresponding IGBT transistor. The adjust circuit can detect a change in the voltage of the low voltage power supply of the IPM module 4100 in real time, and disable the output of the module when the voltage is detected to be too low due to the fluctuation of the low voltage power supply. In response to the stored electronic energy of the drive motor causing charge accumulation of the IGBT transistor, the adjust circuit first cuts off the drive output and the drive signal of the IGBT transistor, in order to naturally release the charge accumulated in the IGBT transistor, and starts timing at the same time. When the low voltage power supply is restored to normal, if the time from a moment when the voltage drops till another moment when the voltage is restored to normal exceeds the second target time, the adjust circuit directly controls the drive circuit to output the drive signal to the corresponding IGBT transistor; if the time from a moment when the voltage drops till another moment when the voltage is restored to normal is less than the second target time but larger than the first target time, the output module outputs the low impedance state during the remaining time from a moment when the voltage is restored to normal till another moment when the timing reaches the target time, in order to continue releasing the charge accumulated in the IGBT transistor; and if the time from a moment when the voltage drops till another moment when the voltage is restored to normal is less than the first target time, the output module outputs the low impedance state and the high impedance state in a continuous alternating manner during the first target time with a relatively small duty cycle, ensuring a more safe releasing, and then outputs the low impedance state and the high impedance state in a continuous alternating manner with a relatively large duty cycle in a duration that the timing is larger than the first target time, to allow a faster releasing. This ensures a quick releasing of the charge accumulated in the IGBT transistor, and shortens the resuming time of the IPM module 4100, thereby allowing the module to quickly resume normal operation, as well as preventing operating reliability of the module from being affected by the impact of the accumulated charge.

The present disclosure further provides a controller for an air conditioner, configured for controlling the air conditioner. For example, for an inverter of an air conditioner, there may include a controller for an indoor unit and a controller for an outdoor unit. The controller for the indoor unit is configured to drive loads such as a fan motor of the indoor unit, and an air guide bar. The controller for the outdoor unit is configured to drive loads such as a compressor, a fan motor of the outdoor unit, and a four-way valve. The controller for the outdoor unit includes any of the above-mentioned IPM modules for driving the compressor. If the fan motor of the outdoor unit is a DC fan, the controller also includes any of the above-mentioned IPM modules for driving the DC fan. Similarly, if the fan motor of the indoor unit is a DC fan, the controller also includes any of the above-mentioned IPM modules for driving the DC fan. The specific embodiments of the IPM module and the introduced technical effects may refer to the above embodiments, which is not detailed herein.

In the description of the present disclosure, the terms "first embodiment", "second embodiment", "example" and the like refer to that the specific methods, devices or features described in conjunction with the embodiment or example is included in the at least one embodiment or example. In the present disclosure, the exemplary expressions of the above terms are not necessarily directed to a same embodiment or examples. Moreover, the specific methods, devices or features described may be combined in any suitable manner in any one or more embodiments or examples. In addition, the technical solutions between the various embodiments of the present disclosure may be combined with each other, but must be based on the realization of those skilled in the art. When the combination of technical solutions is contradictory or impossible to implement, it should be considered that the combination of the technical solutions does not exist, and not within the scope of protection required by this disclosure.

The foregoing description merely portrays some illustrative embodiments in accordance with the disclosure and therefore is not intended to limit the patentable scope of the disclosure. Any equivalent structure or flow transformations that are made taking advantage of the specification and accompanying drawings of the disclosure and any direct or indirect applications thereof in other related technical fields shall all fall in the scope of protection of the disclosure.

I claim:

1. An intelligent power module comprising:
three-phase upper bridge arm IGBT transistors,
three-phase lower bridge arm IGBT transistors, and
drive circuits and adjust circuits each corresponding to one of the three-phase upper bridge arm IGBT transistors and the three-phase lower bridge arm IGBT transistors;
wherein:
an output end of each drive circuit is connected to a signal input end of a corresponding adjust circuit, a signal output end of each adjust circuit is connected to a gate of a corresponding IGBT transistor;
a positive electrode and a negative electrode of a power supply end of the adjust circuit corresponding to each three-phase upper bridge arm IGBT transistor are respectively connected to a positive electrode and a negative electrode of a power supply of a high voltage region of a corresponding phase;
a positive electrode and a negative electrode of a power supply end of the adjust circuit corresponding to each three-phase lower bridge arm IGBT transistor are respectively connected to a positive electrode and a negative electrode of a power supply of a low voltage region of the intelligent power module; and
wherein:
each adjust circuit is configured to:
detect a voltage of the power supply end of the adjust circuit;
in response to the detection that the voltage is less than a predetermined voltage threshold, cut off a drive signal output from the drive circuit to the corresponding IGBT transistor; and
in response to the detection that the voltage is greater than or equal to the predetermined voltage threshold, release charge in the corresponding IGBT transistor and control the drive circuit to output the drive signal to the corresponding IGBT transistor after a predetermined time.

2. The intelligent power module according to claim 1, wherein each of the adjust circuits comprises a voltage detection module, a time delay module, an output module, and a first switch;
wherein:
an input end of the voltage detection module, a power supply end of the time delay module, and a power supply end of the output module are connected to form the power supply end of the adjust circuit;
an output end of the voltage detection module is respectively connected to a control end of the time delay module and a control end of the first switch;
an output end of the time delay module is connected to a control end of the output module;
an input end of the output module is the signal input end of the adjust circuit;
an output end of the output module is connected to an input end of the first switch; and
an output end of the first switch is the signal output end of the adjust circuit; and
wherein:
in response to the detection that the voltage of the input end of the voltage detection module is less than the predetermined voltage threshold, the voltage detection module is configured to turn the first switch from an on state to an off state;
in response to the detection that the voltage of the input end of the voltage detection module is greater than or equal to the predetermined voltage threshold, the voltage detection module is configured to control the first switch to turn on and the time delay module to start timing, the time delay module is configured to control the output module to release the charge in the corresponding IGBT transistor; and
in response to a determination that a timing reaches a predetermined time, the time delay module is configured to control the drive circuit to output the drive signal to the corresponding IGBT transistor through the output module.

3. The intelligent power module according to claim 2, wherein the time delay module comprises a second switch, a first resistor, and a first capacitor; and
wherein:
a control end of the second switch is the control end of the time delay module;
an input end of the second switch is connected to the positive electrode of the power supply end of the adjust circuit;
a connection end of an output end of the second switch and an end of the first resistor is the output end of the time delay module;
the other end of the first resistor is connected to an end of the first capacitor; and
the other end of the first capacitor is connected to the negative electrode of the power supply end of the adjust circuit.

4. The intelligent power module according to claim 3, wherein the time delay module further comprises a shaping unit; and
wherein:
an input end of the shaping unit is the connection end of the output end of the second switch and the end of the first resistor;
an output end of the shaping unit is the output end of the time delay module; and
the shaping unit is configured to shape a control signal output from the time delay module and output the shaped control signal to the control end of the output module.

5. The intelligent power module according to claim 4, wherein the shaping unit comprises a first NOT gate and a second NOT gate; and wherein:
an input end of the first NOT gate is the input end of the shaping unit;
an output end of the first NOT gate is connected to an input end of the second NOT gate; and
an output end of the second NOT gate is the output end of the shaping unit.

6. The intelligent power module according to claim 2, wherein the voltage detection module comprises a comparator and a voltage source; and
wherein:
a non-inverting end of the comparator is connected to the positive electrode of the power supply end of the adjust circuit;
a positive output end of the voltage source is connected to an inverting end of the comparator; and
a negative output end of the voltage source is connected to the negative electrode of the power supply end of the adjust circuit.

7. The intelligent power module according to claim 2, wherein each adjust circuit further comprises a shaping and amplifying module; and
wherein:
an input end of the shaping and amplifying module is the signal input end of the adjust circuit;
an output end of the shaping and amplifying module is connected to the input end of the output module; and
the shaping and amplifying module is configured to amplify and shape a signal input from the signal input end of the adjust circuit, and output the amplified and shaped signal to the input end of the output module.

8. The intelligent power module according to claim 7, wherein the shaping and amplifying module comprises a third NOT gate and a fourth NOT gate; and
wherein:
an input end of the third NOT gate is the input end of the shaping and amplifying module;
an output end of the third NOT gate is connected to an input end of the fourth NOT gate; and
an output end of the fourth NOT gate is the output end of the shaping and amplifying module.

9. The intelligent power module according to claim 8, wherein a size of a MOS transistor in the third NOT gate is half the size of a MOS transistor in the fourth NOT gate.

10. The intelligent power module according to claim 2, wherein the output module comprises a third switch, a first PMOS transistor, and a second NMOS transistor; and,
wherein:
a control end of the third switch is the control end of the output module;
a first selection end of the third switch is connected to the positive electrode of the power supply end of the adjust circuit;
a second selection end of the third switch is connected to a gate of the first PMOS transistor;
a fixed end of the third switch is connected to a gate of the second NMOS transistor;
a source of the first PMOS transistor is connected to the positive electrode of the power supply end of the adjust circuit;
a connection end of a drain of the first PMOS transistor and a drain of the second NMOS transistor is the output end of the output module; and
a source of the second NMOS transistor is connected to the negative electrode of the power supply end of the adjust circuit.

11. The intelligent power module according to claim 1, wherein the adjust circuit is further configured to:
detect the voltage of the power supply end of the adjust module;
in response to the detection that the voltage is less than the predetermined voltage threshold, cut off the drive signal output from the drive circuit to the corresponding IGBT transistor; and
in response to the detection that the voltage is greater than or equal to the predetermined voltage threshold, output a low impedance state and a high impedance state in a continuous alternating manner, to release the charge in the corresponding IGBT transistor, and control the drive circuit to output the drive signal to the corresponding IGBT transistor after the predetermined time.

12. The intelligent power module according to claim 11, wherein each of the adjust circuits comprises a voltage detection module, a time delay module, an output module, a signal generator, and a first switch;
wherein:
an input end of the voltage detection module, a power supply end of the time delay module, a power supply end of the signal generator, and a power supply end of the output module are connected to form the power supply end of the adjust circuit;
an output end of the voltage detection module is respectively connected to a control end of the time delay module and a control end of the first switch;
an output end of the time delay module is connected to a second control end of the output module;
an output end of the signal generator is connected to a first control end of the output module;
an input end of the output module is the signal input end of the adjust circuit;
an output end of the output module is connected to an input end of the first switch; and
an output end of the first switch is the signal output end of the adjust circuit; and
wherein:
in response to the detection that the voltage is less than the predetermined voltage threshold, the voltage detection module is configured to turn the first switch from an on state to an off state;
in response to the detection that the voltage is greater than or equal to the predetermined voltage threshold, the voltage detection module is configured to control the first switch to turn on and the time delay module to starting timing, the signal generator is configured to control the output module to output the low impedance state and the high impedance state in the continuous alternating manner, to release the charge in the corresponding IGBT transistor; and in response to a determination that a timing reaches a predetermined time, the time delay module is configured to control the drive module to output the drive circuit to the corresponding IGBT transistor through the output module.

13. The intelligent power module according to claim 12, wherein the output module comprises a third switch, a first PMOS transistor, and a second NMOS transistor; and
wherein:
a control end of the third switch is the second control end of the output module;
a first selection end of the third switch is the first control end of the output module;
a second selection end of the third switch is connected to a gate of the first PMOS transistor;

a fixed end of the third switch is connected to a gate of the second NMOS transistor;

a source of the first PMOS transistor is connected to the positive electrode of the power supply end of the adjust circuit;

a connection end of a drain of the first PMOS transistor and a drain of the second NMOS transistor is the output end of the output module; and a source of the second NMOS transistor is connected to the negative electrode of the power supply end of the adjust circuit.

14. The intelligent power module according to claim 1, wherein the adjust circuit is further configured to:

detect the voltage of the power supply end of the adjust module;

in response to the detection that the voltage is less than the predetermined voltage threshold, cut off the drive signal output from the drive circuit to the corresponding IGBT transistor, and start timing;

in response to a determination that a timing does not reach a predetermined time, and the detection that the voltage is greater than or equal to the predetermined voltage threshold, release the charge in the corresponding IGBT transistor; and in response to a determination that the timing reaches the predetermined time, control the drive circuit to output the drive signal to the corresponding IGBT transistor.

15. The intelligent power module according to claim 14, wherein each of the adjust circuits comprises a voltage detection module, a counting module, an output module, and a first switch;

wherein:

an input end of the voltage detection module, a power supply end of the counting module, and a power supply end of the output module are connected to form the power supply end of the adjust circuit;

an output end of the voltage detection module is respectively connected to an input end of the counting module and a control end of the first switch;

an output end of the counting module is connected to a control end of the output module;

an input end of the output module is the signal input end of the adjust circuit; an output end of the output module is connected to an input end of the first switch; and an output end of the first switch is the signal output end of the adjust circuit; and wherein:

the voltage detection module is configured to, in response to the detection that the voltage of the input end of the adjust circuit is less than the predetermined voltage threshold, control the counting module to start timing, and turn the first switch from an on state in which the first switch is normally operated to an off state; and the counting module is configured to, at beginning of the timing, output a first trigger signal, to control the output module to output a low impedance state;

in response to the determination that a timing does not reach a predetermined time, and the detection that the voltage is greater than or equal to the predetermined voltage threshold, the output module is configured to output the low impedance state, to release the charge in the corresponding IGBT transistor; and in response to the determination that the timing reaches the predetermined time, the counting module is configured to output a second trigger signal, to control the drive module to output the drive circuit to the corresponding IGBT transistor.

16. The intelligent power module according to claim 15, wherein the output module comprises a second switch, a third switch, a first PMOS transistor, and a second NMOS transistor; and wherein:

an input end of the second switch, a first selection end of the third switch, and a source of the first PMOS transistor are connected to the positive electrode of the power supply end of the adjust module;

an output end of the second switch is connected to a control end of the third switch;

a second selection end of the third switch is connected to a gate of the first PMOS transistor;

a fixed end of the third switch is connected to a gate of the second NMOS transistor;

a connection end of a drain of the first PMOS transistor and a drain of the second NMOS transistor is the output end of the output module; and a source of the second NMOS transistor is connected to the negative electrode of the power supply end of the adjust circuit.

17. The intelligent power module according to claim 1, wherein the adjust circuit is further configured to:

detect the voltage of the power supply end of the adjust module;

in response to the detection that the voltage is less than the predetermined voltage threshold, cut off the drive signal output from the drive circuit to the corresponding IGBT transistor, and start timing;

in response to a determination that a timing does not reach a predetermined target time, and the detection that the voltage is greater than or equal to the predetermined voltage threshold, output a low impedance state and a high impedance state in a continuous alternating manner, to release the charge in the corresponding IGBT transistor; and in response to a determination that the timing reaches the predetermined target time, control the drive circuit to output the drive signal to the corresponding IGBT transistor.

18. The intelligent power module according to claim 17, wherein each of the adjust circuits comprises a voltage detection module, a counting module, a signal generator, an output module, and a first switch;

wherein:

an input end of the voltage detection module, a power supply end of the counting module, a power supply end of the signal generator, a power supply end of the output module are connected to form the power supply end of the adjust circuit;

an output end of the voltage detection module is respectively connected to an input end of the counting module and a control end of the first switch;

an output end of the counting module is connected to a first control end of the output module;

an output end of the signal generator is connected to a second control end of the output module;

an input end of the output module is the signal input end of the adjust circuit;

an output end of the output module is connected to an input end of the first switch; and an output end of the first switch is the signal output end of the adjust circuit; and wherein:

the voltage detection module is configured to, in response to the detection that the voltage of the input end of the adjust circuit is less than the predetermined voltage threshold, control the counting module to start timing, and turn the first switch from an on state in which the first switch is normally operated to an off state; and the counting module is configured to, at beginning of the timing, output a first trigger signal, and control, by using the first trigger signal combined with a pulse signal output from the signal generator, the output module to output a low impedance state and a high impedance state in a continuous alternating manner;

in response to the determination that a timing does not reach a predetermined time, and the detection that the voltage is greater than or equal to the predetermined voltage threshold, the output module is configured to output the low impedance state and the high impedance state in the continuous alternating manner, to release the charge in the corresponding IGBT transistor; and in response to the determination that the timing reaches the predetermined time, the counting module is configured to output a second trigger signal, to control the drive module to output the drive circuit to the corresponding IGBT transistor.

19. The intelligent power module according to claim 18, wherein the output module comprises a second switch, a third switch, a first PMOS transistor, and a second NMOS transistor; and wherein:

an input end of the second switch and a source of the first PMOS transistor are respectively connected to the positive electrode of the power supply end of the adjust module;

an output end of the second switch is connected to a control end of the third switch;

a control end of the second switch is the first control end of the output module;

a first selection end of the third switch is the second control end of the output module;

a second selection end of the third switch is connected to a gate of the first PMOS transistor;

a fixed end of the third switch is connected to a gate of the second NMOS transistor;

a connection end of a drain of the first PMOS transistor and a drain of the second NMOS transistor is the output end of the output module; and a source of the second NMOS transistor is connected to the negative electrode of the power supply end of the adjust circuit.

20. The intelligent power module according to claim 1, wherein the adjust circuit is further configured to:

detect the voltage of the power supply end of the adjust module;

in response to the detection that the voltage is less than the predetermined voltage threshold, cut off the drive signal output from the drive circuit to the corresponding IGBT transistor, and start timing; and in response to the detection that the voltage is larger than or equal to the predetermined voltage threshold, if the timing does not reach a first predetermined target time, output a low impedance state and a high impedance state in a continuous alternating manner, to release the charge in the corresponding IGBT transistor;

if the timing exceeds the first predetermined target time but does not reach a second predetermined target time, output the low impedance state, to continue releasing the charge in the corresponding IGBT transistor; and if the timing reaches the second predetermined target time, control the drive circuit to output the drive signal to the corresponding IGBT transistor.

21. The intelligent power module according to claim 20, wherein each of the adjust circuits comprises a voltage detection module, a counting module, a signal generator, an output module, and a first switch;

wherein:

an input end of the voltage detection module, a power supply end of the counting module, a power supply end of the signal generator, a power supply end of the output module are connected to form the power supply end of the adjust circuit;

an output end of the voltage detection module is respectively connected to an input end of the counting module and a control end of the first switch;

a first output end of the counting module is connected to a first control end of the output module;

a second output end of the counting module is connected to a second control end of the output module;

an output end of the signal generator is connected to a third control end of the output module;

an input end of the output module is the signal input end of the adjust circuit;

an output end of the output module is connected to an input end of the first switch; and an output end of the first switch is the signal output end of the adjust circuit; and wherein:

the voltage detection module is configured to, in response to the detection that the voltage of the input end of the adjust circuit is less than the predetermined voltage threshold, control the counting module to start timing, and turn the first switch from an on state in which the first switch is normally operated to an off state; and the counting module is configured to:

at beginning of the timing, output a first trigger signal simultaneously through the first output end the second output end of the counting module, to control, by using the first trigger signal combined with a pulse signal output from the signal generator, the output module to output a low impedance state and a high impedance state in a continuous alternating manner;

in response to a determination that a timing exceeds a first target time but does not reach a second target time, output a second trigger signal through the second output end of the counting module, to control the output module to output the low impedance state; and in response to the detection that the voltage is larger than or equal to the predetermined voltage threshold, if the timing does not reach the first target time, the output module is configured to output the low impedance state and the high impedance state in the continuous alternating manner, to release the charge in the corresponding IGBT transistor; if the timing exceeds the first target time but does not reach the second target time, the output module is configured to output the low impedance state, to continue releasing the charge in the corresponding IGBT transistor; and if the timing reaches the second first target time, the counting module is configured to output a third trigger signal, to control the drive module to output the drive circuit to the corresponding IGBT transistor.

22. The intelligent power module according to claim 21, wherein the output module comprises a second switch, a third switch, a fourth switch, a first PMOS transistor, and a second NMOS transistor; and wherein:
an input end of the second switch, a second selection end of the third switch, and a source of the first PMOS transistor are respectively connected to the positive electrode of the power supply end of the adjust module;
an output end of the second switch is connected to a control end of the fourth switch;
a control end of the second switch is the first control end of the output module;
a control end of the third switch is the second control end of the output module;
a first selection end of the third switch is the third control end of the output module;
a fixed end of the third switch is connected to a first selection end of the fourth switch;
a second selection end of the fourth switch is connected to a gate of the first PMOS transistor;
a fixed end of the fourth switch is connected to a gate of the second NMOS transistor;
a connection end of a drain of the first PMOS transistor and a drain of the second NMOS transistor is the output end of the output module; and
a source of the second NMOS transistor is connected to the negative electrode of the power supply end of the adjust circuit.

23. The intelligent power module according to claim 1, wherein the adjust circuit is further configured to:
detect the voltage of the power supply end the adjust module;
in response to the detection that the voltage is less than the predetermined voltage threshold, cut off the drive signal output from the drive circuit to the corresponding IGBT transistor, and start timing; and
in response to the detection that the voltage is larger than or equal to the predetermined voltage threshold,
  if a timing does not reach a first predetermined target time, output a low impedance state and a high impedance state in a continuous alternating manner with the low impedance state as a first duty cycle, to release the charge in the corresponding IGBT transistor;
  if the timing exceeds the first predetermined target time but does not reach a second predetermined target time, output the low impedance state and the high impedance state in the continuous alternating manner with the low impedance state as a second duty cycle, to release the charge in the corresponding IGBT transistor, wherein the first duty cycle is smaller than the second duty cycle; and
  if the timing reaches the second predetermined target time, control the drive circuit to output the drive signal to the corresponding IGBT transistor.

24. The intelligent power module according to claim 23, wherein each of the adjust circuits comprises a voltage detection module, a counting module, a first signal generator, a second signal generator, an output module, and a first switch;
wherein:
an input end of the voltage detection module, a power supply end of the counting module, a power supply end of the first signal generator, a power supply end of the second signal generator, and a power supply end of the output module are connected to form the power supply end of the adjust circuit;
an output end of the voltage detection module is respectively connected to an input end of the counting module and a control end of the first switch;
a first output end of the counting module is connected to a first control end of the output module;
a second output end of the counting module is connected to a second control end of the output module;
an output end of the first signal generator is connected to a third control end of the output module;
an output end of the second signal generator is connected to a fourth control end of the output module;
an input end of the output module is the signal input end of the adjust circuit, an output end of the output module is connected to an input end of the first switch, and an output end of the first switch is the signal output end of the adjust circuit; and
wherein:
the voltage detection module is configured to, in response to the detection that the voltage of the input end of the adjust circuit is less than the predetermined voltage threshold, control the counting module to start timing, and turn the first switch from an on state in which the first switch is normally operated to an off state; and
the counting module is configured to, at beginning of the timing, output a first trigger signal simultaneously through the first output end the second output end of the counting module, to control, by using the first trigger signal combined with a pulse signal output from the first signal generator, the output module to output a low impedance state and a high impedance state in a continuous alternating manner with the low impedance state as a first duty cycle;
in response to a determination that a timing exceeds a first predetermined target time but does not reach a second predetermined target time, the counting module is configured to output a second trigger signal through the second output end of the counting module, to control, by using the second trigger signal combined with a pulse signal output from the second signal generator, the output module to output the low impedance state with the low impedance state as a second duty cycle; and
in response to the detection that the voltage is larger than or equal to the predetermined voltage threshold,
if the timing does not reach the first predetermined target time, the output module is configured to output the low impedance state and the high impedance state in the continuous alternating manner with the impedance state as the first duty cycle, to release the charge in the corresponding IGBT transistor;
if the timing exceeds the first target time but does not reach the second target time, the output module is configured to output the low impedance state and the high impedance state in the continuous alternating manner with the impedance state as the second duty cycle, to continue releasing the charge in the corresponding IGBT transistor; and
if the timing reaches the second first target time, the counting module is configured to output a third trigger signal, to control the drive module to output the drive circuit to the corresponding IGBT transistor.

25. The intelligent power module according to claim 24, wherein the output module comprises a second switch, a third switch, a fourth switch, a first PMOS transistor, and a second NMOS transistor; and
wherein:
an input end of the second switch and a source of the first PMOS transistor are respectively connected to the positive electrode of the power supply end of the adjust module;

an output end of the second switch is connected to a control end of the fourth switch;

a control end of the second switch is the first control end of the output module;

a control end of the third switch is the second control end of the output module;

a first selection end of the third switch is the third control end of the output module;

a second selection end of the third switch is the fourth control end of the output module;

a fixed end of the third switch is connected to a first selection end of the fourth switch;

a second selection end of the fourth switch is connected to a gate of the first PMOS transistor;

a fixed end of the fourth switch is connected to a gate of the second NMOS transistor;

a connection end of a drain of the first PMOS transistor and a drain of the second NMOS transistor is the output end of the output module; and a source of the second NMOS transistor is connected to the negative electrode of the power supply end of the adjust circuit.

26. A controller for an air conditioner comprising: an intelligent power module according to claim 1.

* * * * *